United States Patent
Montorsi et al.

(10) Patent No.: US 11,876,538 B2
(45) Date of Patent: Jan. 16, 2024

(54) CONVOLUTIONAL CODE RATE MATCHING METHOD AND WIRELESS COMMUNICATION APPARATUS

(71) Applicant: HUAWEI TECHNOLOGIES CO., LTD., Guangdong (CN)

(72) Inventors: Guido Montorsi, Turin (IT); Sergio Benedetto, Turin (IT); Wei Lin, Shenzhen (CN); Yan Xin, Ottawa (CA); Ming Gan, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/856,773

(22) Filed: Jul. 1, 2022

(65) Prior Publication Data

US 2022/0337272 A1    Oct. 20, 2022

Related U.S. Application Data

(63) Continuation of application No. PCT/CN2020/142583, filed on Dec. 31, 2020.

(30) Foreign Application Priority Data

Jan. 3, 2020   (CN) .......................... 202010006457.9

(51) Int. Cl.
*H03M 13/00* (2006.01)
*H03M 13/23* (2006.01)
*H04L 1/00* (2006.01)

(52) U.S. Cl.
CPC ..... *H03M 13/6362* (2013.01); *H03M 13/235* (2013.01); *H03M 13/6356* (2013.01); *H04L 1/0069* (2013.01)

(58) Field of Classification Search
None
See application file for complete search history.

(56) References Cited

U.S. PATENT DOCUMENTS

| | | | |
|---|---|---|---|
| 2018/0278369 A1* | 9/2018 | Ge ........................ | H04L 1/0058 |
| 2019/0349141 A1 | 11/2019 | Ahn et al. | |
| 2021/0328718 A1* | 10/2021 | Chen ..................... | H04L 1/1819 |

FOREIGN PATENT DOCUMENTS

| | | |
|---|---|---|
| CN | 101330355 A | 12/2008 |
| CN | 103188044 A | 7/2013 |

(Continued)

OTHER PUBLICATIONS

Zhendong Zhou et al., Adaptive Coded MIMO Systems with Near Full Multiplexing Gain Using Outdated CSI, IEEE, Jan. 2011, 9 pages.

(Continued)

*Primary Examiner* — Guerrier Merant
(74) *Attorney, Agent, or Firm* — HUAWEI TECHNOLOGIES CO., LTD.

(57) ABSTRACT

A convolutional code rate matching method and a communication apparatus are provided. A puncturing pattern of a second codeword at a second code rate is obtained based on a puncturing pattern of a first codeword at a first code rate. A second puncturing location set of the second codeword is a subset of a first puncturing location set of the first codeword. When a transmit device decreases a code rate from the first code rate to the second code rate, a redundant bit is sent at a location of a complementary set of the second puncturing location set relative to the first puncturing location set. Compared with the first puncturing location set, the second puncturing location set may obtain more incremental redundant bits, to decrease a channel encoding rate. This can improve decoding performance of a convolutional code.

11 Claims, 7 Drawing Sheets

(56) References Cited

FOREIGN PATENT DOCUMENTS

| | | | | |
|---|---|---|---|---|
| CN | 107359967 A | 11/2017 | | |
| EP | 1883162 A1 * | 1/2008 | ........ | H03M 13/2957 |
| EP | 1883162 A1 | 1/2008 | | |

OTHER PUBLICATIONS

B.B. Jimenez et al., Performance analysis of a type II hybrid ARQ protocol based on RCPC codes for the IEEE802.11a random access MAC protocol, IEEE, May 30, 2005-Jun. 1, 2005, 5 pages.

Y. Bian et al., New very high rate punctured convolutional codes, Electronics Letters, Jul. 7, 1994, 2 pages.

IEEE Std 802.11-2016, IEEE Standard for Information technology—Telecommunications and information exchange between systems Local and metropolitan area networks—Specific requirements, Part 11: Wireless LAN Medium Access Control (MAC) and Physical Layer (PHY) Specifications, Approved Dec. 7, 2016, 3534 pages.

IEEE Std 802.11ac-2013, IEEE Standard for Information technology—Telecommunications and information exchange between systems Local and metropolitan area networks—Specific requirements, Part 11: Wireless LAN Medium Access Control (MAC) and Physical Layer (PHY) Specifications, Amendment 4: Enhancements for Very High Throughput for Operation in Bands below 6 GHz, Approved Dec. 11, 2013, 425 pages.

IEEE P802.11ax/D6.0, Nov. 2019, Draft Standard for Information technology—Tele-communications and information exchange between systems Local and metropolitan area networks—Specific requirements, Part 11: Wireless LAN Medium Access Control (MAC) and Physical Layer (PHY) Specifications, Amendment 1: Enhancements for High Efficiency WLAN, 780 pages.

Thomas J. Richardson et al., Efficient Encoding of Low-Density Parity-Check Codes, IEEE Transactions on Information Theory, vol. 47, No. 2, Feb. 2001, 19 pages.

W. A. Syafei et al, Performance Evaluation and ASIC Design of LDPC Decoder for IEEE 802.11n, 2009 IEEE, 5 pages.

\* cited by examiner

500

| Generate a second codeword, where a puncturing pattern of a second codeword is generated based on a puncturing pattern of a first codeword, the puncturing pattern of the first codeword includes a first puncturing location set, the puncturing pattern of the second codeword includes a second puncturing location set, and the second puncturing location set is a subset of the first puncturing location set | 510 |

| Send the second codeword | 520 |

FIG. 5

CONVOLUTIONAL CODE RATE MATCHING METHOD AND WIRELESS COMMUNICATION APPARATUS

CROSS-REFERENCE TO RELATED APPLICATIONS

This application is a continuation of International Application No. PCT/CN2020/142583, filed on Dec. 31, 2020, which claims priority to Chinese Patent Application No. 202010006457.9, filed on Jan. 3, 2020. The disclosures of the aforementioned applications are hereby incorporated by reference in their entireties.

TECHNICAL FIELD

This disclosure relates to the channel encoding field, and in particular, to a convolutional code rate matching method and a wireless communication apparatus.

BACKGROUND

A binary convolutional code (binary convolutional code, BCC) has been widely used as a mandatory channel code since it was proposed. A convolutional code used in a wireless local area network (wireless local area network, WLAN) standard is a BCC at a code rate of 1/2, and another higher code rate may be obtained by puncturing the BCC at a code rate of 1/2. Puncturing patterns of different code rates are different from and independent of each other.

It is proposed in the next-generation WLAN 802.11be standard that an incremental redundancy-hybrid automatic repeat request (incremental redundancy-hybrid automatic repeat request, IR-HARQ) mechanism is introduced based on the original 802.11ax standard. In the IR-HARQ mechanism, a data transmit end sends an information bit and some redundant bits during initial transmission. If the initial transmission fails, data is retransmitted. During retransmission, the transmit end sends more redundant bits to decrease a channel encoding rate, to achieve better decoding effects.

However, in the existing WLAN standard, different puncturing patterns having different code rates cannot meet a rate compatibility requirement if a channel encoding rate is decreased after redundant bits are added through retransmission in the IR-HARQ mechanism.

SUMMARY

This disclosure provides a convolutional code rate matching method and a wireless communication apparatus, to meet a requirement of adding incremental redundant bits through retransmission in an IR-HARQ mechanism, so as to decrease a channel encoding rate. This improves a decoding success rate of a receive end, and further improves decoding performance.

According to a first aspect, this disclosure provides a convolutional code rate matching method. The method includes: generating a second codeword, where a puncturing pattern of the second codeword is generated based on a puncturing pattern of a first codeword, the puncturing pattern of the first codeword includes a first puncturing location set, the puncturing pattern of the second codeword includes a second puncturing location set, and the second puncturing location set is a subset of the first puncturing location set; and sending the second codeword.

In the technical solutions of this disclosure, a puncturing location set of a codeword at a high code rate includes all elements in a puncturing location set of a codeword at a low code rate. In addition, an extra puncturing location in the puncturing location set of the codeword at the high code rate is used to transmit a redundant bit. In this way, a diversity gain may be implemented. When the convolutional code rate matching method is applied to an IR-HARQ mechanism, a requirement of adding incremental redundant bits through retransmission can be met, to decrease a channel encoding rate. This improves a decoding success rate of a receive end, and further improves decoding performance.

In addition, because the decoding success rate of the receive device increases, a quantity of retransmission times decreases, and a retransmission delay decreases.

With reference to the first aspect, in some implementations of the first aspect, the method further includes: outputting a third codeword at a third code rate, where the third codeword is obtained by performing a repetition operation on a mother codeword based on a repetition pattern, the mother codeword is obtained by performing convolutional encoding on an information bit sequence, the third code rate is a code rate in Table E, and a repetition location of the repetition operation is a first repetition location corresponding to the third code rate in Table E and all repetition locations located before the first repetition location in Table E. For Table E, refer to description of the method embodiment.

According to a second aspect, this disclosure provides a convolutional code decoding method. The method includes: receiving a second channel receive sequence from a transmit device; and decoding a combined LLR sequence based on a second puncturing pattern, where the combined LLR sequence is obtained by combining a first LLR sequence and a second LLR sequence, the first LLR sequence is obtained by processing a first channel receive sequence, the second LLR sequence is obtained by processing the second channel receive sequence, the first LLR sequence corresponds to a first codeword of the transmit device, the second LLR sequence corresponds to a second codeword of the transmit device, the second puncturing pattern of the second codeword includes a second puncturing location set, a first puncturing pattern of the first codeword includes a first puncturing location set, and the second puncturing location set is a subset of the first puncturing location set.

With reference to the first aspect, in some implementations of the first aspect, the method further includes: before sending the second codeword, performing convolutional encoding on the information bit sequence, to obtain the mother codeword at a code rate of 1/2; performing rate matching on the mother codeword based on a puncturing pattern corresponding to the first puncturing location set, to obtain the first codeword; and sending the first codeword.

The mother codeword in this disclosure is a codeword (or referred to as a codeword sequence) at a code rate of 1/2 that is obtained by performing convolutional encoding by using a structure of an encoder shown in FIG. 1 in the specification. In other words, the mother codeword is a codeword on which a puncturing operation or a repetition operation is not performed.

In some implementations of the first aspect or the second aspect, the first codeword corresponds to a first code rate, the second codeword corresponds to a second code rate, either the first code rate or the second code rate is a code rate in Table A, the first puncturing location set includes a first puncturing location corresponding to the first code rate in Table A and all puncturing locations located before the first puncturing location in Table A, and the second puncturing location set includes a second puncturing location corresponding to the second code rate in Table A and all puncturing locations located before the second puncturing location in Table A. For Table A, refer to description of the method embodiment.

In some implementations of the first aspect or the second aspect, the first code rate is 5/6, the first puncturing location set is {59, 31, 11, 39, 51, 19, 3, 43, 23, 15, 47, 55, 27, 7, 35, 0, 36, 8, 32, 53, 21, 4, 45, 16}, the second code rate is 3/4, and the second puncturing location set is {59, 31, 11, 39, 51, 19, 3, 43, 23, 15, 47, 55, 27, 7, 35, 0, 36, 8, 32, 53};

the first code rate is 5/6, the first puncturing location set is {59, 31, 11, 39, 51, 19, 3, 43, 23, 15, 47, 55, 27, 7, 35, 0, 36, 8, 32, 53, 21, 4, 45, 16}, the second code rate is 2/3, and the second puncturing location set is {59, 31, 11, 39, 51, 19, 3, 43, 23, 15, 47, 55, 27, 7, 35}; or the first code rate is 3/4, the first puncturing location set is {59, 31, 11, 39, 51, 19, 3, 43, 23, 15, 47, 55, 27, 7, 35, 0, 36, 8, 32, 53}, the second code rate is 2/3, and the second puncturing location set is {59, 31, 11, 39, 51, 19, 3, 43, 23, 15, 47, 55, 27, 7, 35}.

In some implementations of the first aspect or the second aspect, the first codeword corresponds to a first code rate, the second codeword corresponds to a second code rate, either the first code rate or the second code rate is a code rate in Table B, the first puncturing location set includes a first puncturing location corresponding to the first code rate in Table B and all puncturing locations located before the first puncturing location in Table B, and the second puncturing location set includes a second puncturing location corresponding to the second code rate in Table B and all puncturing locations located before the second puncturing location in Table B. For Table B, refer to description of the method embodiment.

In some implementations of the first aspect or the second aspect, the first codeword corresponds to a first code rate, the second codeword corresponds to a second code rate, either the first code rate or the second code rate is a code rate in Table C, the first puncturing location set includes a first puncturing location corresponding to the first code rate in Table C and all puncturing locations located before the first puncturing location in Table C, and the second puncturing location set includes a second puncturing location corresponding to the second code rate in Table C and all puncturing locations located before the second puncturing location in Table C. For Table C, refer to description of the method embodiment.

With reference to the first aspect, in some implementations of the first aspect, the first codeword corresponds to a first code rate, the second codeword corresponds to a second code rate, either the first code rate or the second code rate is a code rate in Table D, the first puncturing location set includes a first puncturing location corresponding to the first code rate in Table D and all puncturing locations located before the first puncturing location in Table D, and the second puncturing location set includes a second puncturing location corresponding to the second code rate in Table D and all puncturing locations located before the second puncturing location in Table D. For Table D, refer to description of the method embodiment.

It should be noted that Table A, Table B, Table C, Table D, and Table E respectively correspond to Table 1, Table 3, Table 5, Table 7, and Table 9 in the specification.

According to a third aspect, this disclosure provides a communication apparatus. The communication apparatus has functions of implementing the method in any one of the first aspect or the optional implementations of the first aspect. The functions may be implemented by hardware, or may be implemented by hardware executing corresponding software. The hardware or the software includes one or more units corresponding to the foregoing functions.

In an implementation, the communication apparatus may include a memory and a processor. The memory is configured to store a computer program or instructions, and the processor reads, from the memory, and runs the computer program or the instructions, to implement the method in any one of the first aspect or the optional implementations of the first aspect.

Optionally, the memory may be a physically independent unit, or may be integrated with the processor.

In another implementation, the communication apparatus includes an input interface circuit, a logic circuit, and an output interface circuit. The input interface circuit is configured to obtain a to-be-coded information bit sequence. The logic circuit is configured to perform the method in any one of the first aspect or the optional implementations of the first aspect, to generate a codeword at a corresponding code rate. The output interface circuit is configured to output the codeword.

Optionally, the input interface circuit and the output interface circuit may be integrated together, and referred to as an interface circuit.

According to a fourth aspect, this disclosure provides a communication apparatus. The communication apparatus has functions of implementing the method in any one of the second aspect or the optional implementations of the second aspect. The functions may be implemented by hardware, or may be implemented by hardware executing corresponding software. The hardware or the software includes one or more units corresponding to the foregoing functions.

In an implementation, the communication apparatus may include a memory and a processor. The memory is configured to store a computer program or instructions, and the processor reads, from the memory, and runs the computer program or the instructions, to implement the method in any one of the second aspect or the optional implementations of the second aspect.

Optionally, the memory may be a physically independent unit, or may be integrated with the processor.

In another implementation, the communication apparatus includes an input interface circuit, a logic circuit, and an output interface circuit. The input interface circuit is configured to receive a channel receive sequence. The logic circuit is configured to perform the method in any one of the second aspect or the optional implementations of the second aspect, and decode a combined LLR sequence. The output interface circuit is configured to output a decoding result.

Optionally, the input interface circuit and the output interface circuit may be integrated together, and referred to as an interface circuit.

According to a fifth aspect, this disclosure provides a communication apparatus, including an interface circuit and a processor. The interface circuit is configured to receive computer code or instructions, and transmit the computer code or the instructions to the processor, and the processor runs the computer code or the instructions, to implement the method in any one of the first aspect or the implementations of the first aspect.

According to a sixth aspect, this disclosure provides a communication apparatus, including an interface circuit and a processor. The interface circuit is configured to receive computer code or instructions, and transmit the computer code or the instructions to the processor, and the processor runs the computer code or the instructions, to implement the method in any one of the second aspect or the implementations of the second aspect.

According to a seventh aspect, this disclosure provides a communication device, including at least one processor. The at least one processor is coupled to at least one memory, the at least one memory is configured to store a computer program or instructions, and the at least one processor is configured to invoke, from the at least one memory, and run the computer program or the instructions, to enable the communication device to perform the method in any one of the first aspect or the implementations of the first aspect.

According to an eighth aspect, this disclosure provides a communication device, including at least one processor. The at least one processor is coupled to at least one memory, the at least one memory is configured to store a computer program or instructions, and the at least one processor is configured to invoke, from the at least one memory, and run the computer program or the instructions, to enable the communication device to perform the method in any one of the second aspect or the implementations of the second aspect.

According to a ninth aspect, this disclosure provides a computer-readable storage medium. The computer-readable storage medium stores computer instructions, and when the computer instructions are run on a computer, the method in any one of the first aspect or the implementations of the first aspect is implemented.

According to a tenth aspect, this disclosure provides a computer-readable storage medium. The computer-readable storage medium stores computer instructions, and when the computer instructions are run on a computer, the method in any one of the second aspect or the implementations of the second aspect is implemented.

According to an eleventh aspect, this disclosure provides a computer program product. The computer program product includes computer program code, and when the computer program code is run on a computer, the method in any one of the first aspect or the implementations of the first aspect is implemented.

According to a twelfth aspect, this disclosure provides a computer program product. The computer program product includes computer program code, and when the computer program code is run on a computer, the method in any one of the second aspect or the implementations of the second aspect is implemented.

According to a twelfth aspect, this disclosure provides a wireless communication system, including the communication device in the seventh aspect and the communication device in the eighth aspect.

BRIEF DESCRIPTION OF DRAWINGS

FIG. 5 is a flowchart of a convolutional code rate matching method according to this disclosure;

DESCRIPTION OF EMBODIMENTS

Figure 1:
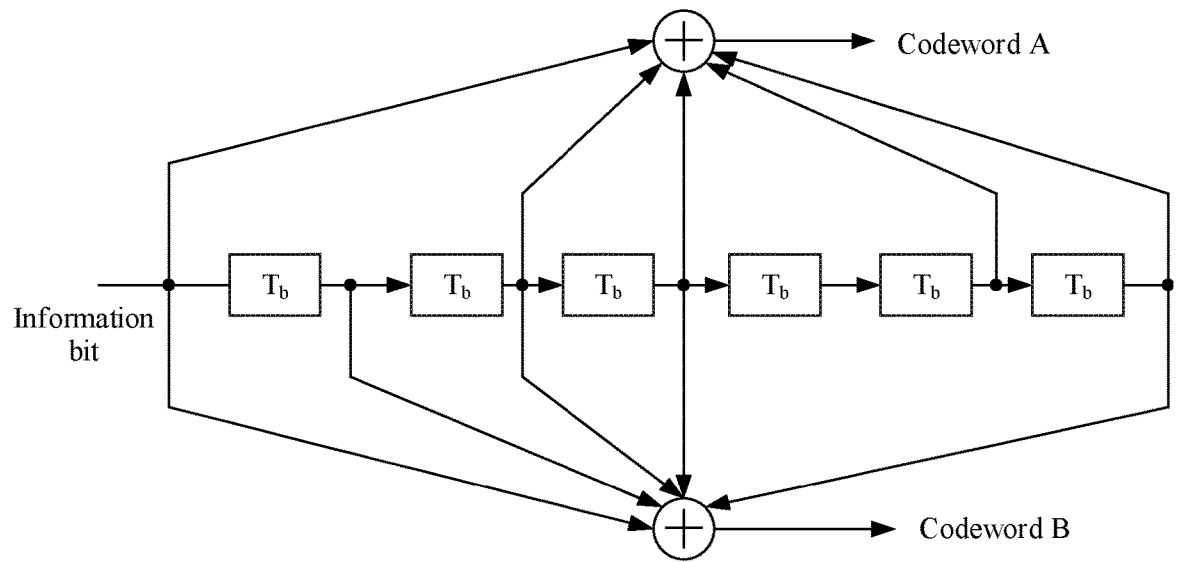
FIG. 1 is a schematic diagram of a structure of an encoder of a BCC.

The following describes technical solutions in this disclosure with reference to the accompanying drawings.

For ease of understanding the technical solutions of this disclosure, the following briefly describes related technologies and concepts.

Since the 802.11 standard was proposed, a binary convolutional code (binary convolutional code, BCC) has been widely used as a channel encoding scheme to encode and decode a signaling SIG field in a frame header and a data part. In the 802.11ax standard, due to forward compatibility and low complexity of the convolutional code, the convolutional code is still the only manner of encoding a SIG field in a frame header of a physical frame. The 802.11ax standard specifies channel encoding of a data part as follows:

(1) When the BCC is used as a scheme to encode the data part, a quantity of encoders working simultaneously is 1.

(2) The BCC is applied to limited cases in which modes of a modulation and coding scheme (modulation and coding scheme, MCS) are 0 to 9 and a quantity of multiple-input multiple-output (MIMO) data streams is less than or equal to 4 spatial streams.

In a next-generation wireless local area network (wireless local area network, WLAN) 802.11 be standard of the 802.11ax standard, a hybrid automatic repeat request (hybrid automatic repeat request, HARQ) is proposed, to further improve a throughput rate of a system. The HARQ is mainly used for storage, requesting for retransmission, and combination and demodulation. When decoding data fails, a receive end stores the received data and requests a transmit end to retransmit data. The receive end combines the retransmitted data and the previously received and stored data, and performs decoding. A success rate of data decoding can be improved by using a diversity gain.

The HARQ may generally include two types: chase combining (chase combining, CC) and incremental redundancy (incremental redundancy, IR), which may respectively be referred to as a CC HARQ and an IR HARQ.

In a HARQ-only mechanism, the receive end directly discards data that is incorrectly decoded. However, although the data that is incorrectly decoded cannot be correctly decoded independently, the data still includes a portion of information. Therefore, the information is used in the CC HARQ. In other words, data that is correctly decoded is stored in a memory, and is combined with data that is retransmitted by the transmit end for decoding. In the IR HARQ, an information bit and some redundant bits are sent during initial transmission. If the receive end incorrectly decodes data and requests the transmit end to retransmit data, the transmit end adds extra redundant bits during retransmission. If decoding fails during one transmission, a code rate of a channel code is decreased by retransmitting more redundant bits, to improve a decoding success rate. If decoding with the retransmitted redundant bits still fails, the receive end requests the transmit end to retransmit data again. As a quantity of retransmission times increases, redundant bits are continuously accumulated, and the code rate of the channel code is continuously decreased, to achieve better decoding effects.

The BCC is referred to as a convolutional code because data is related to binary polynomial sliding in an encoding process of the BCC. The BCC is a channel code with a memory. An encoding rule of the BCC is that k information bits are encoded to obtain an n-bit codeword, where k and n are positive integers. The n codewords obtained through encoding are related to both the currently input k information bits and L−1 previous information bits, where L is a constraint length of the convolutional code.

A convolutional code used by the WLAN is a BCC at a code rate of 1/2, where k=1 and n=2. The encoder of the BCC has six shift registers, for example, $T_b$ in FIG. 1, and a constraint length is 7. In other words, the two bits obtained through encoding are related to both the currently input information bits and the six information bits that are input before the two bits. A structure of the encoder may be shown in FIG. 1.

FIG. 1 is a schematic diagram of the structure of the encoder of the BCC. One information bit $K_i$ is input, to generate two codewords, namely, $A_i$ and $B_i$, and an output codeword bit sequence is $(A_1B_1A_2B_2 \ldots A_iB_i \ldots )$.

The WLAN standard defines that an original BCC may be punctured, to obtain a codeword at a higher code rate. It should be understood that puncturing is an operation of performing rate matching, and means that some bits of an original BCC are removed, so that a codeword obtained through puncturing can match a bearer capability of a physical channel. In addition to the puncturing operation, a repetition operation is another manner of rate matching, and is described in the following. Puncturing is usually performed based on a puncturing pattern. As defined in the WLAN standard, the puncturing pattern may be represented by a 2×P matrix V. A first row of the matrix V indicates a puncturing pattern of the codeword $A_i$ in a puncturing period, and a second row indicates a puncturing pattern of the codeword bit $B_i$ in a puncturing period. P is a grid period of the puncturing pattern. A period of a codeword bit is 2P. In the matrix V, a bit "1" indicates codeword bit transmission at a location of the bit "1", and a bit "0" indicates codeword bit puncturing at a location of the bit "0", that is, transmission is not performed. The following describes a puncturing process with reference to FIG. 2 and FIG. 3.

Figure 2:
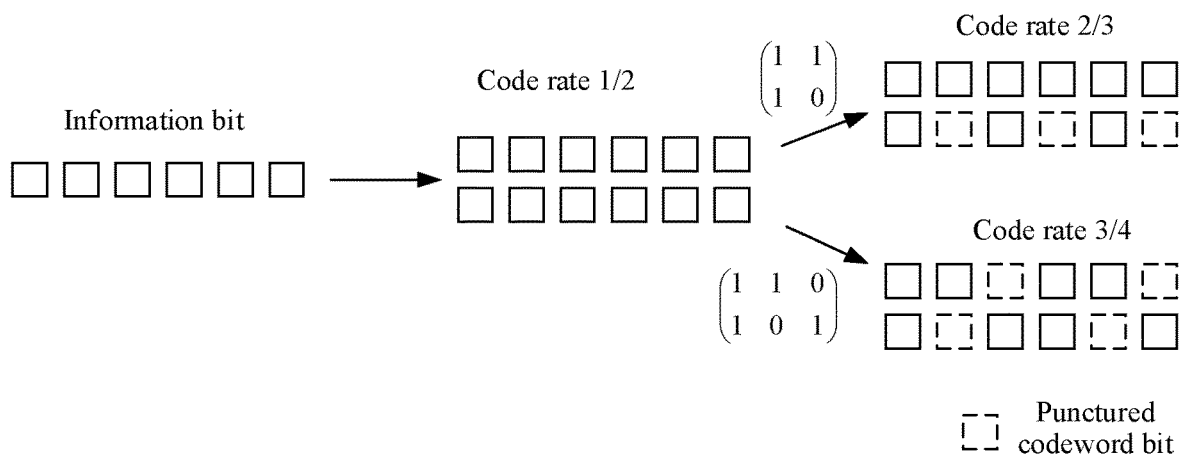
FIG. 2 is a puncturing pattern of a BCC at a code rate of 2/3, or 3/4.

FIG. 2 is a puncturing pattern of a BCC at a code rate of 2/3 or 3/4. As shown in FIG. 2, it is assumed that a code rate of an original BCC is 1/2. Convolutional encoding is performed on an input information bit, to obtain a BCC at a code rate of 1/2, and a codeword bit sequence may be represented as $(A_1B_1A_2B_2 \ A_3B_3A_4B_4 \ A_5B_5A_6B_6 \ldots )$.

For example, if the puncturing pattern is $$\begin{pmatrix} 1 & 1 \\ 1 & 0 \end{pmatrix},$$

a codeword bit sequence obtained through puncturing is $(A_1B_1A_2A_3B_3A_4A_5A_6 \ B_5A_6 \ldots )$. It can be learned that a code rate of a codeword obtained through puncturing is 2/3.

$$\begin{pmatrix} 1 & 1 & 0 \\ 1 & 0 & 1 \end{pmatrix},$$

For another example, if the puncturing pattern is a codeword bit sequence obtained through puncturing is $(A_1B_1A_2B_3A_4B_4 \ A_5B_6 \ldots )$. It can be learned that a code rate of a codeword obtained through puncturing is 3/4.

Figure 3:
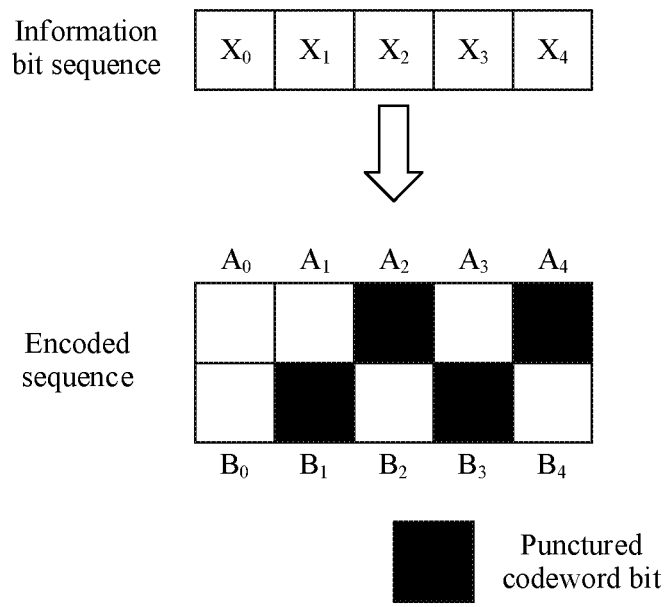
FIG. 3 is a puncturing pattern of a BCC at a code rate of 5/6.

FIG. 3 is a puncturing pattern of a BCC at a code rate of 5/6. As shown in FIG. 3, some bits of an information bit sequence are $(X_0X_1X_2X_3X_4X_5)$, and a puncturing operation is performed on the information bit sequence based on the puncturing pattern shown in FIG. 3. A codeword bit sequence obtained through encoding is $(A_0B_0A_1B_2A_3 \ B_4 \ldots )$. Therefore, it may be learned that the puncturing pattern may be represented as $$\begin{pmatrix} 1 & 1 & 0 & 1 & 0 \\ 1 & 0 & 1 & 0 & 1 \end{pmatrix},$$

and a code rate obtained through encoding is 5/6.

In addition, it can be learned from puncturing patterns shown in FIG. 2 and FIG. 3 that, when the code rate is 2/3, the grid period P=2, and the period of the codeword bit is 2P=4. When the code rate is 3/4, the grid period P=3, and the period of the codeword bit is 2P=6. When the code rate is 5/6, the grid period P=5, and the period of the codeword bit is 2P=10.

The following describes the technical solutions of this disclosure in detail.

Figure 4A:
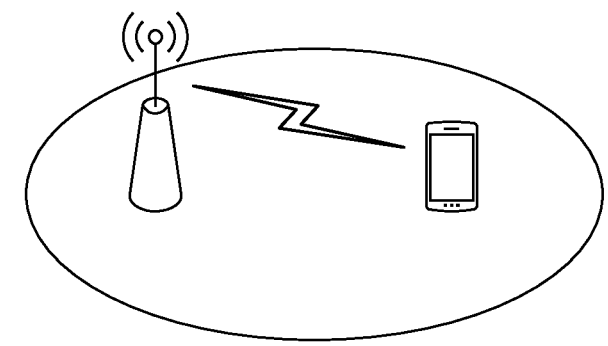
FIG. 4(*a*) and FIG. 4(*b*) are diagrams of system architectures to which an embodiment of this disclosure is applicable.
Figure 4B:
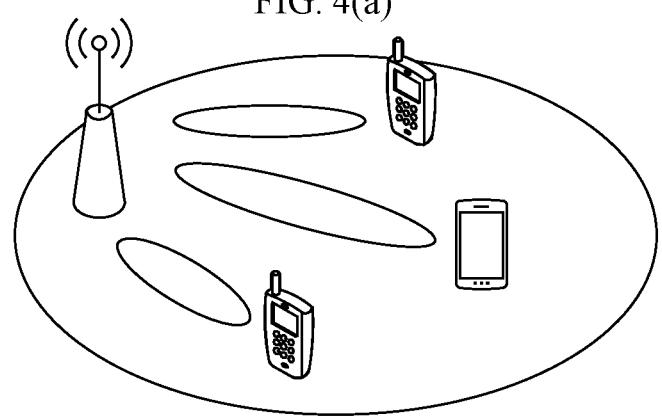

FIG. 4(*a*) and FIG. 4(*b*) are diagrams of system architectures to which an embodiment of this disclosure is applicable. The wireless communication system includes at least one network device and one or more terminal devices. The at least one network device communicates with the one or more terminal devices by using a wireless communication technology. For example, FIG. 4(*a*) shows that a network device communicates with a single terminal device. FIG. 4(*b*) shows that a network device communicates with a plurality of terminal devices. Optionally, communication between the network device and the terminal device may further include downlink transmission in which the network device sends a signal to the terminal device, and uplink transmission in which the terminal device sends a signal to the network device. This is not limited herein.

The terminal device in embodiments of this disclosure is also referred to as user equipment (user equipment, UE), a terminal (terminal), a mobile phone (mobile phone), a tablet computer (tablet computer), a laptop computer (laptop computer), a wearable device (for example, a smart watch, a smart band, a smart helmet, or smart glasses), another device that has a wireless access capability, for example, an intelligent vehicle, any Internet of things (Internet of things, IOT) device including any smart home device (such as a smart meter and a smart home appliance) and smart city device (such as a security or monitoring device, and an intelligent transportation facility), a terminal device in a 5G system or a future communication system, or the like.

The network device in embodiments of this disclosure may be a base station. The base station is also sometimes referred to as a wireless access point (access point, AP), a transmission reception point (transmission reception point, TRP), or a transmission point (transmission point, TP). Optionally, the base station may be a next generation NodeB (next generation NodeB, gNB) in a 5th generation (5th generation, 5G) system or an evolved NodeB (evolved NodeB, eNB) in a long term evolution (long term evolution, LTE) system. In addition, base stations may be classified into a macro base station (macro base station) or a micro base station (micro base station) based on different physical forms or transmit power of the base stations. The micro base station is also sometimes referred to as a small base station or a small cell (small cell). In addition, the network device may alternatively be a network node that forms a gNB or a TRP, for example, a baseband unit (baseband unit, BBU), a centralized unit (centralized unit, CU), or a distributed unit (distributed unit, DU).

For example, embodiments of this disclosure are applicable to a scenario in which an AP communicates with a STA in a WLAN. Optionally, the AP may communicate with a single STA, or the AP simultaneously communicates with a plurality of STAs. Specifically, communication between the AP and the plurality of STAs may further be classified into downlink transmission in which the AP simultaneously sends signals to the plurality of STAs, and uplink transmission in which the plurality of STAs send signals to the AP.

The technical solutions provided in this disclosure may support compatibility with a plurality of rates.

For the BCC-based IR HARQ, in initial transmission, a BCC is usually transmitted at a high code rate based on a channel condition and a link adaptation algorithm of the system. The high code rate may be obtained by puncturing a BCC at a code rate of 1/2. Data of a codeword bit obtained through puncturing may be obtained based on a codeword in the initial transmission. If an error occurs in the initial transmission, a transmit end needs to retransmit a codeword bit at a puncturing location in the initial transmission, or retransmit some codeword bits that have been transmitted. Therefore, a receive end combines the retransmitted codeword bit and the codeword bit in the initial transmission for decoding. It can be learned that a lower encoding rate may be obtained through IR HARQ retransmission. A quantity of IR HARQ retransmission times may be set to, for example, 1, 2, or 3.

To adapt to the IR HARQ transmission mechanism, new incremental redundant bits of BCCs need to be generated for puncturing patterns or repetition patterns of the BCCs allowing rate compatibility, and the puncturing patterns or the repetition patterns at code rates need to be compatible with each other. Compatibility of the puncturing patterns means that a puncturing pattern at a lower code rate may be obtained by padding a puncturing pattern at a higher code rate with a codeword bit at a puncturing location. In this way, the codeword bit in the IR HARQ retransmission belongs to a puncturing location set of the codeword in the initial transmission.

In embodiments of this disclosure, an important factor that determines error control performance of the BCC is mainly a free Hamming distance (which is denoted as $d_{free}$ in the following), namely, a minimum Hamming distance between any two valid codewords. A free Hamming distance of a convolutional code is equal to a path metric difference between an all-zero path and a minimum non-zero path that returns from an all-zero state to a non-zero state. A smaller $d_{free}$ value indicates worse error control performance of the BCC. For two BCCs with a same $d_{free}$ value, a smaller quantity of codewords corresponding to $d_{free}$ indicates better error control performance. In the following, a minimum quantity of codewords corresponding to $d_{free}$ is denoted as $N_{min}$.

Therefore, in embodiments of this disclosure, a puncturing solution and a repetition solution are obtained by using a design principle of maximum $d_{free}$ and a minimum quantity of codewords corresponding to $d_{free}$. In addition, the puncturing solution and the repetition solution support compatibility with code rates, and are applicable to the IR HARQ.

FIG. 5 is a flowchart of a convolutional code rate matching method according to this disclosure.

Optionally, the method shown in FIG. 5 may be performed by a transmit device, or a chip or a circuit system disposed in a transmit device. The circuit system may be, for example, an integrated circuit or a logic circuit. For example, the chip may be a system on a chip (system on a chip, SoC) chip or a baseband modem (modem) chip. This is not limited herein. The following uses a transmit device as an example for description. The transmit device may be a terminal device or a network device. It should be understood that the transmit device in embodiments of this disclosure is also an encoding device. The following uses an example in which the transmit device executes a procedure in FIG. 5 for description.

510: The transmit device generates a second codeword.

A puncturing pattern of the second codeword is generated based on a puncturing pattern of a first codeword. The puncturing pattern of the first codeword includes a first puncturing location set, and the puncturing pattern of the second codeword includes a second puncturing location set. The second puncturing location set is a subset of the first puncturing location set.

It should be understood that the transmit device performs convolutional encoding on an information bit sequence, to obtain a mother codeword at a code rate of 1/2. In other words, an original code rate of a BCC is 1/2. Another codeword at a higher code rate is obtained by puncturing the mother codeword at the code rate of 1/2.

In this embodiment of this disclosure, the mother codeword at the code rate of 1/2 is used as a basic codeword, and a codeword at a high code rate is obtained by puncturing the basic codeword. Further, a codeword at a higher code rate is obtained by puncturing the codeword at the high code rate. The rest may be deduced by analogy. A puncturing location set of a codeword at a low code rate is a subset of a puncturing location set of a codeword at a high code rate.

For ease of description, it is assumed that the codeword at the high code rate is referred to as the first codeword, and the puncturing location set of the codeword at the high code rate is the first puncturing location set. The codeword at the low code rate is referred to as the second codeword, the puncturing location set of the codeword at the low code rate is the second puncturing location set, and the second puncturing location set is a subset of the first puncturing location set.

In other words, a puncturing pattern of the codeword at the low code rate is obtained by padding some puncturing locations of a puncturing pattern of the codeword at the high code rate.

Puncturing location sets of codewords at different code rates are in an inclusion relationship. For example, the second puncturing location set is a subset of the first puncturing location set, that is, the second puncturing location set includes the first puncturing location set. In other words, the first puncturing location set is included in the second puncturing location set, and a complement of the first puncturing location set relative to the second puncturing location set is used as a location for padding with a redundant bit.

520: The transmit device sends the second codeword.

In the technical solutions of this disclosure, a puncturing location set of a codeword at a high code rate includes all elements in a puncturing location set of a codeword at a low code rate.

In addition, an extra puncturing location in the puncturing location set of the codeword at the high code rate is used to transmit a redundant bit. In this way, a diversity gain may be implemented. This improves decoding performance of a receive device.

In one of the technical solutions of this disclosure, a puncturing pattern of another codeword at a higher code rate is obtained based on the mother codeword at the original code rate of 1/2 in the WLAN. Puncturing patterns corresponding to different code rates meet the following condition: A puncturing location set of a puncturing pattern corresponding to a low code rate is a subset of a puncturing location set of a puncturing pattern corresponding to a high code rate. Puncturing patterns of codewords at higher code rates are different from puncturing patterns specified for the code rates in the existing WLAN. Hereinafter, the solution is referred to as a solution 1.

In another solution, based on the mother codeword at the original code rate of 1/2 in the WLAN, the mother codeword is punctured by reusing a puncturing pattern corresponding to another code rate (for example, 2/3, 3/4, or 5/6) in the WLAN, to obtain a codeword, at a corresponding code rate, used as a basic codeword. Then, a puncturing pattern corresponding to the basic codeword is gradually padded with a puncturing location, to gradually obtain a puncturing pattern corresponding to a lower code rate. Hereinafter, the solution is referred to as a solution 2.

It may be understood that both the solution 1 and the solution 2 are obtained based on the mother codeword at the code rate of 1/2.

The following describes the solution 1 and the solution 2.

Solution 1

Based on the mother codeword at the code rate of 1/2, puncturing patterns of a plurality of codewords at higher code rates are obtained, supporting compatibility with a plurality of code rates.

Specifically, the mother codeword at the code rate of 1/2 is used as a basic codeword. In a puncturing period, puncturing locations of the basic codeword are searched one by one, so that after codeword bits at the puncturing locations are punctured, "maximum $d_{free}$ and a minimum quantity of codewords corresponding to $d_{free}$" can be ensured, and a puncturing pattern of a codeword at a high code rate is obtained. Further, based on the puncturing pattern of the codeword at the high code rate, puncturing locations that further need to be punctured are searched, so that after codeword bits at newly added puncturing locations are punctured, "maximum $d_{free}$ and a minimum quantity of codewords corresponding to $d_{free}$" can be ensured, and a puncturing pattern of a codeword at a higher code rate is obtained. The rest may be deduced by analogy. Puncturing patterns of codewords at different code rates may be obtained by extension.

Puncturing patterns of codewords at different code rates are obtained by padding puncturing locations based on a puncturing pattern of a codeword at a low code rate, and different puncturing patterns can ensure "maximum $d_{free}$ and a minimum quantity of codewords corresponding to $d_{free}$". Therefore, better error control performance can be obtained.

In other words, a puncturing pattern of a codeword at a high code rate can be compatible with a puncturing pattern of a codeword at a low code rate. A puncturing pattern of a codeword at a low code rate is obtained by padding some puncturing locations of a puncturing pattern of a codeword at a high code rate. In other words, a puncturing location set of a puncturing pattern of a codeword at a low code rate is a subset of a puncturing location set of a puncturing pattern of a codeword at a high code rate.

The following describes the solution 1 by using an example in which a grid period P of a convolutional code is equal to 30 and a codeword bit period 2P is equal to 60.

It may be understood that if the codeword bit period is 60, a range of a location index of a codeword bit is 0 to 59. According to the foregoing extension principle, a puncturing solution shown in Table 1 may be obtained.

TABLE 1

| Code rate | Index of a puncturing location |
|---|---|
| 0.500 | |
| 0.508 | 59 |
| 0.517 | 31 |
| 0.526 | 11 |
| 0.536 | 39 |
| 0.545 | 51 |
| 0.556 | 19 |
| 0.566 | 3 |
| 0.577 | 43 |
| 0.588 | 23 |
| 0.600 | 15 |
| 0.612 | 47 |
| 0.625 | 55 |
| 0.638 | 27 |
| 0.652 | 7 |
| 0.667 | 35 |
| 0.682 | 0 |
| 0.698 | 36 |
| 0.714 | 8 |
| 0.732 | 32 |
| 0.750 | 53 |
| 0.769 | 21 |
| 0.789 | 4 |
| 0.811 | 45 |
| 0.833 | 16 |
| 0.857 | 28 |
| 0.882 | 24 |
| 0.909 | 48 |
| 0.938 | 56 |
| 0.968 | 38 |
| 1.000 | 46 |

In Table 1, a first column is a code rate, and the code rate increases continuously from top to bottom. A second column is an index of a puncturing location.

It can be learned that Table 1 provides a puncturing solution of a plurality of code rates. A puncturing location set of a codeword at a low code rate may be directly obtained by removing some puncturing locations in a puncturing location set of a codeword at a high code rate. In other words, a puncturing location set of a codeword at a low code rate is a subset of a puncturing location set of a codeword at a high code rate. In other words, a puncturing location set of a codeword at a high code rate may be obtained by padding some puncturing locations in a puncturing location set of a codeword at a low code rate.

It should be understood that, in a puncturing period, when a puncturing location of a codeword bit sequence is determined, a puncturing pattern corresponding to a code rate is obtained. Therefore, a puncturing pattern may be indicated by a puncturing location set.

In Table 1, a puncturing pattern corresponding to a code rate is a puncturing location set including a puncturing location corresponding to the code rate in Table 1 and all puncturing locations before the puncturing location in Table 1.

For example, if the code rate is 0.5, and no index in the second column of Table 1 corresponds to 0.5, it means that puncturing does not need to be performed on the codeword bit sequence, and the code rate is 1/2. As described above, in the WLAN, the original code rate of the codeword bit sequence is 1/2, an information bit sequence with a length of k is input, and an encoder outputs a codeword bit sequence with a length of 2 k.

For another example, if a code rate is 2/3 (which corresponds to 0.667 in Table 1), and an index corresponding to 2/3 in the second column of Table 1 is 35, the index 35 is a first puncturing location, and the index 35 and all indexes before the index 35 in the second column of Table 1 form a puncturing location set of a codeword at the code rate of 2/3. Therefore, when the code rate is 2/3, a corresponding puncturing location set is {59, 31, 11, 39, 51, 19, 3, 43, 23, 15, 47, 55, 27, 7, 35}.

For another example, if a code rate is 3/4 (which corresponds to 0.75 in Table 1), and an index corresponding to 3/4 in the second column of Table 1 is 53, the index 53 is a first puncturing location, and the index 53 and all indexes before the index 53 in the second column of Table 1 form a puncturing location set of a codeword at the code rate of 3/4. Therefore, when the code rate is 3/4, a corresponding puncturing location set is {59, 31, 11, 39, 51, 19, 3, 43, 23, 15, 47, 55, 27, 7, 35, 0, 36, 8, 32, 53}.

For another example, if a code rate is 5/6 (which corresponds to 0.833 in Table 1), and an index corresponding to 5/6 in the second column of Table 1 is 16, the index 16 and all indexes before the index 16 in the second column of Table 1 form a puncturing location set of a codeword at the code rate of 5/6. Therefore, when the code rate is 5/6, a corresponding puncturing location set is {59, 31, 11, 39, 51, 19, 3, 43, 23, 15, 47, 55, 27, 7, 35, 0, 36, 8, 32, 53, 21, 4, 45, 16}.

For still another example, if a code rate is 0.938, and an index corresponding to 0.938 in the second column of Table 1 is 56, the index 56 and all indexes before the index 56 in the second column of Table 1 form a puncturing location set of a codeword at the code rate of 0.938. Therefore, when the code rate is 0.938, a corresponding puncturing location set is {59, 31, 11, 39, 51, 19, 3, 43, 23, 15, 47, 55, 27, 7, 35, 0, 36, 8, 32, 53, 21, 4, 45, 16, 28, 24, 48, 56}.

It can be learned that a higher code rate indicates more puncturing locations included in a puncturing location set. In addition, a puncturing location set corresponding to a high code rate is obtained by extending based on a puncturing location set corresponding to a low code rate. In other words, a puncturing location set corresponding to a low code rate is obtained by padding puncturing locations in a puncturing location set corresponding to a high code rate.

The following provides description by using an example.

For example, if the transmit device needs to decrease a code rate from 5/6 to 3/4, the first code rate is 5/6, and the second code rate is 3/4. The first puncturing location corresponding to the code rate 5/6 in Table 1 is 16, and the first puncturing location set including the first puncturing location and all puncturing locations before the first puncturing location in Table 1 is {59, 31, 11, 39, 51, 19, 3, 43, 23, 15, 47, 55, 27, 7, 35, 0, 36, 8, 32, 53, 21, 4, 45, 16}. The second puncturing location corresponding to the code rate 3/4 in Table 1 is 53, and the second puncturing location set including the second puncturing location and all puncturing locations before the second puncturing location in Table 1 is {59, 31, 11, 39, 51, 19, 3, 43, 23, 15, 47, 55, 27, 7, 35, 0, 36, 8, 32, 53}.

The second puncturing location set may be obtained by removing last four puncturing locations in the first puncturing location set. In other words, the puncturing location set of the codeword at the code rate of 3/4 is padded with four puncturing locations {21, 4, 45, 16}, to obtain the puncturing location set of the codeword at the code rate of 5/6.

For another example, a puncturing location set of a codeword at a code rate of 2/3 is {59, 31, 11, 39, 51, 19, 3, 43, 23, 15, 47, 55, 27, 7, 35}. Last five puncturing locations in the puncturing location set of the codeword at the code rate of 2/3 are removed, to obtain a puncturing location set of a codeword at a code rate of 3/4.

It should be noted that Table 1 is for P=30 and 2P=60. Therefore, if there are 30 puncturing locations of a codeword obtained through encoding, a code rate obtained through puncturing is 1. Therefore, in Table 1, a maximum quantity of puncturing locations is 30.

For example, for an original BCC (namely, the mother codeword) at an original code rate is 1/2, if a target code rate is 2/3, codeword bits corresponding to first 15 indexes in the second column in Table 1 need to be punctured, namely, {59, 31, 11, 39, 51, 19, 3, 43, 23, 15, 47, 55, 27, 7, 35}. If a target code rate is 3/4, codeword bits corresponding to first 20 indexes in the second column in Table 1 need to be punctured, namely, {59, 31, 11, 39, 51, 19, 3, 43, 23, 15, 47, 55, 27, 7, 35, 0, 36, 8, 32, 53}.

It can be learned that, for a puncturing pattern of the BCC defined in the WLAN standard, if the grid period is P, the codeword bit period is 2P, and the target code rate R=P/2P−X, where X indicates a quantity of punctured codeword bits.

Puncturing patterns corresponding to code rates in Table 1 are priority puncturing locations that are searched one by one in a puncturing period, so that after codeword bits at the puncturing locations are punctured, "maximum $d_{free}$ and a minimum quantity $N_{min}$ of codewords corresponding to $d_{free}$" can be ensured. Therefore, for $d_{free}$ corresponding to code rates and $N_{min}$, refer to Table 2.

TABLE 2

| Quantity of puncturing locations | Code rate | Index of a puncturing location | $d_{free}$ | $N_{min}$ |
|---|---|---|---|---|
| 0 | 0.500 |  | 10 | 3850 |
| 1 | 0.508 | 59 | 9 | 561 |
| 2 | 0.517 | 31 | 9 | 1160 |
| 3 | 0.526 | 11 | 8 | 102 |
| 4 | 0.536 | 39 | 8 | 233 |
| 5 | 0.545 | 51 | 8 | 488 |
| 6 | 0.556 | 19 | 8 | 770 |
| 7 | 0.566 | 3 | 7 | 67 |
| 8 | 0.577 | 43 | 7 | 161 |
| 9 | 0.588 | 23 | 7 | 279 |
| 10 | 0.600 | 15 | 6 | 11 |
| 11 | 0.612 | 47 | 6 | 22 |
| 12 | 0.625 | 55 | 6 | 46 |
| 13 | 0.638 | 27 | 6 | 82 |
| 14 | 0.652 | 7 | 6 | 128 |
| 15 | 0.667 | 35 | 6 | 176 |
| 16 | 0.682 | 0 | 5 | 11 |
| 17 | 0.698 | 36 | 5 | 34 |
| 18 | 0.714 | 8 | 5 | 124 |
| 19 | 0.732 | 32 | 5 | 290 |
| 20 | 0.750 | 53 | 5 | 780 |
| 21 | 0.769 | 21 | 4 | 23 |
| 22 | 0.789 | 4 | 4 | 67 |
| 23 | 0.811 | 45 | 4 | 247 |
| 24 | 0.833 | 16 | 4 | 700 |
| 25 | 0.857 | 28 | 3 | 23 |
| 26 | 0.882 | 24 | 3 | 116 |
| 27 | 0.909 | 48 | 3 | 265 |
| 28 | 0.938 | 56 | 3 | 747 |
| 29 | 0.968 | 38 | 2 | 65 |
| 30 | 1.000 | 46 | 2 | 1859 |

The following uses an example to describe application of the solution 1 in the IR-HARQ.

For example, if a code rate used for initial data transmission of the transmit device is 5/6, the mother codeword at the code rate of 1/2 is punctured based on the puncturing pattern shown in Table 1 or Table 2, and an index of a codeword bit that is punctured in each puncturing period are shown in Table 1 or Table 2. Specifically, when the code rate is 5/6, 24 indexes are included in a puncturing location set, namely, {59, 31, 11, 39, 51, 19, 3, 43, 23, 15, 47, 55, 27, 7, 35, 0, 36, 8, 32, 53, 21, 4, 45, 16}.

If the initial data transmission fails, the transmit device performs retransmission. It is assumed that a code rate used for retransmission is 2/3, during retransmission, a quantity of incremental redundant bits that need to be transmitted in each puncturing period is 9, and specific bit locations are {0, 36, 8, . . . , 16}, namely, puncturing locations between a puncturing pattern corresponding to the code rate of 5/6 and a puncturing pattern corresponding to the code rate of 2/3. In other words, codeword bit locations corresponding to the nine incremental redundant bits are a complement of a puncturing location set corresponding to the code rate of 2/3 relative to a puncturing location set corresponding to the code rate of 5/6.

A case in which a quantity of retransmission times is greater than one is similar. It may be learned from Table 1 or Table 2 that, as the quantity of retransmission times increases, if a code rate used by the transmit device continuously decreases, puncturing locations of a puncturing pattern corresponding to a low code rate continuously decrease, and a quantity of incremental redundant bits continuously increase. Therefore, a channel encoding rate continuously decreases. This can improve a decoding success rate of the receive device. In addition, because the decoding success rate of the receive device increases, a quantity of retransmission times decreases, and a retransmission delay decreases.

Solution 2

The mother codeword at the code rate of 1/2 is punctured by using a puncturing pattern of another code rate supported in the WLAN standard, to obtain a codeword at another code rate (for example, 2/3, 3/4, or 5/6). Then, the codeword at the another code rate is used as a basic codeword. In a puncturing period, puncturing locations of the basic codeword are searched one by one, so that after codeword bits at the puncturing locations are punctured, "maximum $d_{free}$ and a minimum quantity of codewords corresponding to $d_{free}$" can be ensured, and a puncturing pattern corresponding to a higher code rate is obtained. Further, a same searching principle is used, to obtain a puncturing pattern corresponding to a much higher code rate based on the puncturing pattern corresponding to the higher code rate. The rest may be deduced by analogy. Puncturing patterns corresponding to different code rates may be obtained by extension.

The following provides description by using an example.

For example, in the WLAN, the original code rate 1/2, and code rates 2/3, 3/4, and 5/6 are supported. The code rates are obtained by puncturing the mother codeword by using respective puncturing patterns. A puncturing pattern corresponding to each code rate is as follows:

A puncturing pattern corresponding to the code rate 2/3 is $$\begin{pmatrix} 1 & 1 \\ 1 & 0 \end{pmatrix};$$

a puncturing pattern corresponding to the code rate 3/4 is $$\begin{pmatrix} 1 & 1 & 0 \\ 1 & 0 & 1 \end{pmatrix};$$

or a puncturing pattern corresponding to the code rate 5/6 is $$\begin{pmatrix} 1 & 1 & 0 & 1 & 0 \\ 1 & 0 & 1 & 0 & 1 \end{pmatrix}.$$

The mother codeword at the code rate of 1/2 is punctured by using one of the foregoing three code rates, to obtain a corresponding codeword at a code rate. For ease of description, a code rate obtained through puncturing is denoted as a code rate 1, and a puncturing location set corresponding to the code rate 1 is denoted as a puncturing location set 1.

It may be understood that the code rate 1 may be 2/3, 3/4, or 5/6.

Based on the fixed puncturing location set 1, newly added puncturing locations are further searched, to obtain a code rate higher than the code rate 1 (namely, 2/3), for example, a code rate 2. After codeword bits at the newly added puncturing locations are puncturing, "maximum $d_{free}$ and a minimum quantity of codewords corresponding to $d_{free}$" can be met, to obtain a puncturing location set 2 corresponding to the code rate 2.

It may be learned that the puncturing location set 2 includes all elements in the puncturing location set 1 and some newly added puncturing locations.

Further, based on the puncturing location set 2, newly added puncturing locations are further searched, to obtain a code rate higher than the code rate 2, for example, a code rate 3. After codeword bits at the newly added puncturing locations are puncturing, "maximum $d_{free}$ and a minimum quantity of codewords corresponding to $d_{free}$" can be met, to obtain a puncturing location set 3 corresponding to the code rate 3.

The rest may be deduced by analogy. A code rate 4, a code rate 5, and the like, and a puncturing location set corresponding to a higher code rate can further be obtained.

In this embodiment of this disclosure, according to the foregoing extension principle, the code rate 2/3, 3/4, or 5/6 is used as a basic code rate, to obtain, through extension, a puncturing pattern corresponding to another code rate higher than the basic code rate.

The following describes the solution 2 by using an example in which the grid period P of the convolutional code is equal to 30 and the codeword bit period 2P is equal to 60.

Optionally, in an embodiment, a puncturing pattern $$\begin{pmatrix} 1 & 1 & 0 & 1 & 0 \\ 1 & 0 & 1 & 0 & 1 \end{pmatrix}$$

corresponding to a code rate 5/6 is used as a basic puncturing pattern. On this basis, as shown in Table 3, another code rate and a corresponding puncturing pattern may be obtained according to the extension principle described in the solution 2.

TABLE 3

| Code rate | Index of a puncturing location |
|---|---|
| 0.500 | |
| 0.508 | 57 |
| 0.517 | 23 |
| 0.526 | 37 |
| 0.536 | 4 |
| 0.545 | 17 |

TABLE 3-continued

| Code rate | Index of a puncturing location |
|---|---|
| 0.556 | 48 |
| 0.566 | 24 |
| 0.577 | 44 |
| 0.588 | 8 |
| 0.600 | 33 |
| 0.612 | 53 |
| 0.625 | 28 |
| 0.638 | 3 |
| 0.652 | 43 |
| 0.667 | 14 |
| 0.682 | 58 |
| 0.698 | 34 |
| 0.714 | 18 |
| 0.732 | 54 |
| 0.750 | 13 |
| 0.769 | 38 |
| 0.789 | 7 |
| 0.811 | 47 |
| 0.833 | 27 |

For $d_{free}$ and $N_{min}$ corresponding to a puncturing pattern corresponding to each code rate in Table 3, refer to Table 4.

TABLE 4

| Quantity of puncturing locations | Code rate | Index of a puncturing location | $d_{free}$ | $N_{min}$ |
|---|---|---|---|---|
| 0 | 0.500 | | 10 | 3850 |
| 1 | 0.508 | 57 | 9 | 565 |
| 2 | 0.517 | 23 | 8 | 11 |
| 3 | 0.526 | 37 | 8 | 118 |
| 4 | 0.536 | 4 | 8 | 334 |
| 5 | 0.545 | 17 | 8 | 685 |
| 6 | 0.556 | 48 | 7 | 45 |
| 7 | 0.566 | 24 | 7 | 104 |
| 8 | 0.577 | 44 | 7 | 234 |
| 9 | 0.588 | 8 | 6 | 11 |
| 10 | 0.600 | 33 | 6 | 47 |
| 11 | 0.612 | 53 | 6 | 105 |
| 12 | 0.625 | 28 | 6 | 189 |
| 13 | 0.638 | 3 | 6 | 358 |
| 14 | 0.652 | 43 | 6 | 686 |
| 15 | 0.667 | 14 | 5 | 46 |
| 16 | 0.682 | 58 | 5 | 158 |
| 17 | 0.698 | 34 | 5 | 300 |
| 18 | 0.714 | 18 | 5 | 524 |
| 19 | 0.732 | 54 | 4 | 12 |
| 20 | 0.750 | 13 | 4 | 46 |
| 21 | 0.769 | 38 | 4 | 105 |
| 22 | 0.789 | 7 | 4 | 297 |
| 23 | 0.811 | 47 | 4 | 572 |
| 24 | 0.833 | 27 | 4 | 967 |
| 25 | | | | |
| 26 | | | | |
| 27 | | | | |
| 28 | | | | |
| 29 | | | | |
| 30 | 1.000 | | | |

Optionally, in an embodiment, a puncturing pattern $$\begin{pmatrix} 1 & 1 & 0 \\ 1 & 0 & 1 \end{pmatrix}$$

corresponding to a code rate 3/4 is used as a basic puncturing pattern. On this basis, as shown in Table 5, another code rate and a corresponding puncturing pattern may be obtained according to the extension principle described in the solution 2.

TABLE 5

| Code rate | Index of a puncturing location |
|---|---|
| 0.500 | |
| 0.508 | 3 |
| 0.517 | 27 |
| 0.526 | 51 |
| 0.536 | 22 |
| 0.545 | 46 |
| 0.556 | 10 |
| 0.566 | 39 |
| 0.577 | 58 |
| 0.588 | 21 |
| 0.600 | 28 |
| 0.612 | 4 |
| 0.625 | 33 |
| 0.638 | 57 |
| 0.652 | 52 |
| 0.667 | 15 |
| 0.682 | 40 |
| 0.698 | 16 |
| 0.714 | 45 |
| 0.732 | 9 |
| 0.750 | 34 |

For $d_{free}$ and $N_{min}$ corresponding to a puncturing pattern corresponding to each code rate in Table 5, refer to Table 6.

TABLE 6

| Quantity of puncturing locations | Code rate | Index of a puncturing location | $d_{free}$ | $N_{min}$ |
|---|---|---|---|---|
| 0 | 0.500 | | 10 | 3850 |
| 1 | 0.508 | 3 | 9 | 566 |
| 2 | 0.517 | 27 | 8 | 24 |
| 3 | 0.526 | 51 | 8 | 114 |
| 4 | 0.536 | 22 | 8 | 330 |
| 5 | 0.545 | 46 | 7 | 11 |
| 6 | 0.556 | 10 | 7 | 23 |
| 7 | 0.566 | 39 | 7 | 83 |
| 8 | 0.577 | 58 | 7 | 217 |
| 9 | 0.588 | 21 | 7 | 442 |
| 10 | 0.600 | 28 | 6 | 36 |
| 11 | 0.612 | 4 | 6 | 93 |
| 12 | 0.625 | 33 | 6 | 225 |
| 13 | 0.638 | 57 | 6 | 391 |
| 14 | 0.652 | 52 | 6 | 22 |
| 15 | 0.667 | 15 | 5 | 56 |
| 16 | 0.682 | 40 | 5 | 114 |
| 17 | 0.698 | 16 | 5 | 196 |
| 18 | 0.714 | 45 | 5 | 369 |
| 19 | 0.732 | 9 | 5 | 619 |
| 20 | 0.750 | 34 | 5 | 927 |
| 21 | | | | |
| 22 | | | | |
| 23 | | | | |
| 24 | | | | |
| 25 | | | | |
| 26 | | | | |
| 27 | | | | |
| 28 | | | | |
| 29 | | | | |
| 30 | 1.000 | | | |

Optionally, in an embodiment, a puncturing pattern $$\begin{pmatrix} 1 & 1 \\ 1 & 0 \end{pmatrix}$$

corresponding to a code rate 2/3 is used as a basic puncturing pattern. On this basis, as shown in Table 6, another code rate and a corresponding puncturing pattern may be obtained according to the extension principle described in the solution 2.

TABLE 7

| Code rate | Index of a puncturing location |
|---|---|
| 0.500 | |
| 0.508 | 3 |
| 0.517 | 35 |
| 0.526 | 11 |
| 0.536 | 43 |
| 0.545 | 23 |
| 0.556 | 55 |
| 0.566 | 51 |
| 0.577 | 19 |
| 0.588 | 27 |
| 0.600 | 47 |
| 0.612 | 15 |
| 0.625 | 59 |
| 0.638 | 39 |
| 0.652 | 7 |
| 0.667 | 31 |

For $d_{free}$ and $N_{min}$ corresponding to a puncturing pattern corresponding to each code rate in Table 7, refer to Table 8.

TABLE 8

| Quantity of puncturing locations | Code rate | Index of a puncturing location | $d_{free}$ | $N_{min}$ |
|---|---|---|---|---|
| 0 | 0.500 | | 10 | 3850 |
| 1 | 0.508 | 3 | 9 | 566 |
| 2 | 0.517 | 35 | 9 | 1164 |
| 3 | 0.526 | 11 | 8 | 115 |
| 4 | 0.536 | 43 | 8 | 244 |
| 5 | 0.545 | 23 | 8 | 484 |
| 6 | 0.556 | 55 | 7 | 11 |
| 7 | 0.566 | 51 | 7 | 81 |
| 8 | 0.577 | 19 | 7 | 176 |
| 9 | 0.588 | 27 | 7 | 332 |
| 10 | 0.600 | 47 | 7 | 541 |
| 11 | 0.612 | 15 | 6 | 12 |
| 12 | 0.625 | 59 | 6 | 46 |
| 13 | 0.638 | 39 | 6 | 82 |
| 14 | 0.652 | 7 | 6 | 128 |
| 15 | 0.667 | 31 | 6 | 176 |

It should be noted that, in Table 3 to Table 8, a code rate 1/2 indicates an original code rate of the convolutional code.

The following uses an example to describe application of the solution 2 in the IR HARQ.

In the solution 2, based on the BCC at the code rate of 1/2 defined by the WLAN, one of the foregoing three puncturing patterns is used as a puncturing pattern of initial transmission. If decoding fails in the initial transmission, on the basis of the puncturing pattern of the initial transmission, codeword bits that have been punctured are gradually transmitted based on a priority. A principle for selecting a priority of a puncturing location is as described above. To be specific, in a puncturing period, codeword bit locations that are preferentially punctured are searched one by one, so that codeword bits at the codeword bit locations are punctured, and a minimum free Hamming distance at the code rate and a minimum quantity of codeword bits corresponding to the minimum free Hamming distance can be ensured.

For example, it is assumed that a code rate used in the initial data transmission by the transmit device is 5/6. The transmit device performs convolutional encoding on the information bit sequence, to obtain a BCC at a code rate of 1/2; then performs puncturing on the BCC based on a puncturing pattern corresponding to a code rate R=5/6, to obtain a codeword sequence at a code rate of 5/6, and sends the codeword sequence at the code rate of 5/6. If decoding fails in the initial transmission, a code rate lower than 5/6 is selected based on a target code rate of retransmission and puncturing patterns corresponding to different code rates in Table 3 or Table 4, to increase a quantity of redundant bits in retransmission, and decrease a channel encoding rate. This can improve a decoding success rate of the receive device.

It is known that a puncturing location set corresponding to a code rate 5/6 is {59, 31, 11, 39, 51, 19, 3, 43, 23, 15, 47, 55, 27, 7, 35, 0, 36, 8, 32, 53, 21, 4, 45, 16}, and a puncturing location set corresponding to a code rate 2/3 is {59, 31, 11, 39, 51, 19, 3, 43, 23, 15, 47, 55, 27, 7, 35}. Therefore, when a code rate is decreased from 5/6 to 2/3, a quantity of redundant bits is increased by 9, and indexes are {0, 36, 8, 32, 53, 21, 4, 45, 16}, namely, indexes between a puncturing location corresponding to the code rate 5/6 and a puncturing location corresponding to the code rate 2/3 in Table 3 or Table 4.

It should be noted that, in the solution 2, because a puncturing pattern used in the WLAN standard is reused for each code rate, a puncturing period of a BCC at a code rate of 5/6 is 10 codeword bits. For details, refer to description in FIG. 2 and FIG. 3. A codeword bit period in Table 3 or Table 4 is 60 codeword bits. Therefore, 6 codeword sequences whose puncturing periods are 10 codeword bits are combined, to obtain a codeword sequence whose puncturing period is 60 codeword bits. Indexes of codeword bits in the codeword sequence obtained through combination in ascending order are 0, 1, 2, 3, . . . , 59.

Similarly, a puncturing period of a BCC at a code rate of 2/3 is 4 codeword bits. Therefore, 15 codeword sequences whose puncturing periods are 4 codeword bits are combined, to obtain a codeword sequence whose puncturing period is 60 codeword bits. A puncturing period of a BCC at a code rate of 3/4 is 6 codeword bits. Therefore, 10 codeword sequences whose puncturing periods are 6 codeword bits are combined, to obtain a codeword sequence whose puncturing period is 60 codeword bits.

The foregoing describes the solution 1 and the solution 2 in detail.

It can be learned from tables provided in the solution 1 and the solution 2 that, in data transmission of the transmit device, from a high code rate to a low code rate, puncturing locations continuously decrease, and locations of redundant bits continuously increase. When all codeword bits included in the codeword sequence have been sent (that is, there is no puncturing location), a code rate in this case is the original code rate defined in the WLAN standard, namely, 1/2. If the code rate needs to further be decreased, some codeword bits in the codeword sequence need to be repeated by using a repetition operation.

Further, this disclosure provides a codeword bit repetition solution, so that a code rate is lower than 1/2. The solution is referred to as a solution 3 hereinafter.

Solution 3

A code rate 1/2 is used as a basic code rate. Priority repetition locations of codeword bits included in a codeword sequence are searched one by one, so that after a repetition operation is performed on codeword bits at the repetition locations in the codeword sequence, "maximum $d_{free}$ and a minimum quantity of codewords corresponding to $d_{free}$" can be met, to obtain a codeword at a low code rate (compared with 1/2). On this basis, newly added repetition locations are searched one by one, so that codeword bits at the newly added repetition locations are repeated, to obtain a lower code rate, and "maximum $d_{free}$ and a minimum quantity of codewords corresponding to $d_{free}$" can be met. Therefore, better error control performance is achieved.

For example, in codeword bits included in the mother codeword at the code rate of 1/2, priority repetition locations are searched one by one, so that codeword bits at the repetition locations are repeated, to obtain a lower code rate 1, and "maximum $d_{free}$ and a minimum quantity of codewords corresponding to $d_{free}$" can be met, to obtain a repetition location set 1 corresponding to the code rate 1.

Further, based on the repetition location set 1, newly added puncturing locations are further searched, to obtain a code rate lower than the code rate 1, for example, a code rate 2. After codeword bits at the newly added repetition locations are repeated, "maximum $d_{free}$ and a minimum quantity of codewords corresponding to $d_{free}$" can be met, to obtain a repetition location set 2 corresponding to the code rate 2.

The rest may be deduced by analogy. A code rate 3, a code rate 4, and the like, and a repetition location set corresponding to a lower code rate can further be obtained.

The following describes the repetition solution in Table 9 by using an example in which a grid period P of a convolutional code is equal to 30 and a codeword bit period 2P is equal to 60.

TABLE 9

| A quantity (N) of repetition locations | Code rate | $i_{dx}$ | N | Code rate | $i_{dx}$ | N | Code rate | $i_{dx}$ |
|---|---|---|---|---|---|---|---|---|
| 0 | 0.5000 |  | 60 | 0.25 | 7 | 120 | 0.1667 | 13 |
| 1 | 0.4918 | 30 | 61 | 0.2479 | 32 | 121 | 0.1657 | 41 |
| 2 | 0.4839 | 2 | 62 | 0.2459 | 4 | 122 | 0.1648 | 28 |
| 3 | 0.4762 | 24 | 63 | 0.2439 | 26 | 123 | 0.1639 | 24 |
| 4 | 0.4688 | 46 | 64 | 0.2419 | 48 | 124 | 0.1630 | 2 |
| 5 | 0.4615 | 8 | 65 | 0.2400 | 10 | 125 | 0.1622 | 22 |
| 6 | 0.4545 | 37 | 66 | 0.2381 | 39 | 126 | 0.1613 | 50 |
| 7 | 0.4478 | 54 | 67 | 0.2362 | 56 | 127 | 0.1604 | 18 |
| 8 | 0.4412 | 19 | 68 | 0.2344 | 21 | 128 | 0.1596 | 45 |
| 9 | 0.4348 | 50 | 69 | 0.2326 | 52 | 129 | 0.1587 | 10 |
| 10 | 0.4286 | 15 | 70 | 0.2308 | 17 | 130 | 0.1579 | 26 |
| 11 | 0.4225 | 40 | 71 | 0.2290 | 42 | 131 | 0.1571 | 49 |
| 12 | 0.4167 | 57 | 72 | 0.2273 | 59 | 132 | 0.1563 | 59 |
| 13 | 0.4110 | 27 | 73 | 0.2256 | 29 | 133 | 0.1554 | 25 |
| 14 | 0.4054 | 12 | 74 | 0.2239 | 14 | 134 | 0.1546 | 52 |
| 15 | 0.4000 | 44 | 75 | 0.2222 | 46 | 135 | 0.1538 | 6 |
| 16 | 0.3947 | 5 | 76 | 0.2206 | 7 | 136 | 0.1531 | 37 |
| 17 | 0.3896 | 38 | 77 | 0.2190 | 40 | 137 | 0.1523 | 17 |
| 18 | 0.3846 | 16 | 78 | 0.2174 | 18 | 138 | 0.1515 | 9 |
| 19 | 0.3797 | 49 | 79 | 0.2158 | 51 | 139 | 0.1508 | 30 |
| 20 | 0.3750 | 23 | 80 | 0.2143 | 25 | 140 | 0.1500 | 42 |
| 21 | 0.3704 | 6 | 81 | 0.2128 | 3 | 141 | 0.1493 | 57 |
| 22 | 0.3659 | 42 | 82 | 0.2113 | 8 | 142 | 0.1485 | 38 |
| 23 | 0.3614 | 35 | 83 | 0.2098 | 36 | 143 | 0.1478 | 14 |
| 24 | 0.3571 | 1 | 84 | 0.2083 | 30 | 144 | 0.1471 | 46 |
| 25 | 0.3529 | 28 | 85 | 0.2069 | 0 | 145 | 0.1463 | 1 |
| 26 | 0.3488 | 34 | 86 | 0.2055 | 43 | 146 | 0.1456 | 21 |
| 27 | 0.3448 | 9 | 87 | 0.2041 | 35 | 147 | 0.1449 | 33 |
| 28 | 0.3409 | 58 | 88 | 0.2027 | 12 | 148 | 0.1442 | 8 |
| 29 | 0.3371 | 20 | 89 | 0.2013 | 44 | 149 | 0.1435 | 54 |
| 30 | 0.3333 | 36 | 90 | 0.2000 | 16 | 150 | 0.1429 | 23 |
| 31 | 0.3297 | 10 | 91 | 0.1987 | 22 | 151 | 0.1422 | 0 |
| 32 | 0.3261 | 45 | 92 | 0.1974 | 55 | 152 | 0.1415 | 41 |
| 33 | 0.3226 | 21 | 93 | 0.1961 | 20 | 153 | 0.1408 | 13 |
| 34 | 0.3191 | 53 | 94 | 0.1948 | 50 | 154 | 0.1402 | 20 |
| 35 | 0.3158 | 32 | 95 | 0.1935 | 38 | 155 | 0.1395 | 53 |
| 36 | 0.3125 | 4 | 96 | 0.1923 | 11 | 156 | 0.1389 | 48 |
| 37 | 0.3093 | 26 | 97 | 0.1911 | 37 | 157 | 0.1382 | 4 |
| 38 | 0.3061 | 56 | 98 | 0.1899 | 54 | 158 | 0.1376 | 32 |
| 39 | 0.3030 | 0 | 99 | 0.1887 | 15 | 159 | 0.1370 | 24 |
| 40 | 0.3000 | 17 | 100 | 0.1875 | 47 | 160 | 0.1364 | 12 |
| 41 | 0.2970 | 41 | 101 | 0.1863 | 27 | 161 | 0.1357 | 44 |
| 42 | 0.2941 | 47 | 102 | 0.1852 | 56 | 162 | 0.1351 | 40 |
| 43 | 0.2913 | 11 | 103 | 0.1840 | 23 | 163 | 0.1345 | 5 |
| 44 | 0.2885 | 52 | 104 | 0.1829 | 34 | 164 | 0.1339 | 16 |
| 45 | 0.2857 | 33 | 105 | 0.1818 | 2 | 165 | 0.1333 | 36 |
| 46 | 0.2830 | 25 | 106 | 0.1807 | 9 | 166 | 0.1327 | 58 |
| 47 | 0.2804 | 3 | 107 | 0.1796 | 58 | 167 | 0.1322 | 31 |

TABLE 9-continued

| A quantity (N) of repetition locations | Code rate | $i_{dx}$ | N | Code rate | $i_{dx}$ | N | Code rate | $i_{dx}$ |
|---|---|---|---|---|---|---|---|---|
| 48 | 0.2778 | 18 | 108 | 0.1786 | 28 | 168 | 0.1316 | 39 |
| 49 | 0.2752 | 48 | 109 | 0.1775 | 6 | 169 | 0.1310 | 7 |
| 50 | 0.2727 | 13 | 110 | 0.1765 | 49 | 170 | 0.1304 | 27 |
| 51 | 0.2703 | 39 | 111 | 0.1754 | 24 | 171 | 0.1299 | 19 |
| 52 | 0.2679 | 14 | 112 | 0.1744 | 31 | 172 | 0.1293 | 47 |
| 53 | 0.2655 | 55 | 113 | 0.1734 | 1 | 173 | 0.1288 | 51 |
| 54 | 0.2632 | 31 | 114 | 0.1724 | 45 | 174 | 0.1282 | 11 |
| 55 | 0.2609 | 59 | 115 | 0.1714 | 5 | 175 | 0.1277 | 35 |
| 56 | 0.2586 | 22 | 116 | 0.1705 | 19 | 176 | 0.1271 | 3 |
| 57 | 0.2564 | 51 | 117 | 0.1695 | 53 | 177 | 0.1266 | 23 |
| 58 | 0.2542 | 29 | 118 | 0.1685 | 33 | 178 | 0.1261 | 55 |
| 59 | 0.2521 | 43 | 119 | 0.1676 | 57 | 179 | 0.1255 | 43 |

In Table 9, $i_{dx}$ indicates an index of a repetition location.

In Table 9, any value in a column at which the code rate is located is used as a third code rate, and an index corresponding to the third code rate in the $i_{dx}$ column is a first repetition location. A repetition location set, which is also referred to as a repetition pattern, corresponding to the third code rate includes the first repetition location and all indexes before the first repetition location in the $i_{dx}$ column.

The following describes Table 9 by using an example.

For example, if no repetition location in the $i_{dx}$ column corresponds to a code rate 1/2 (which corresponds to 0.5000 in Table 9), it indicates that there is no repetition location when the code rate is 1/2. In other words, the transmit device performs convolutional encoding on an information bit sequence, to obtain an original code rate 1/2. In this case, no codeword bit is repeated.

An index of a repetition location corresponding to a code rate 0.4688 in the $i_{dx}$ column is 46. In this case, the index 46 and all indexes before the index 46 in the $i_{dx}$ column form a repetition pattern corresponding to the code rate 0.4688. If the transmit device needs to decrease the code rate from 1/2 to 0.4688, location indexes of codeword bits that need to be repeated are 30, 2, 24, 46, that is, a repetition location set is {30, 2, 24, 46}.

If a lower code rate, for example, 1/4, needs to be obtained, a repetition location set is first 60 indexes {30, 2, 24, 46, . . . , 7} in the $i_{dx}$ column in Table 9, specifically, a set including an index 30 corresponding to 0.5, an index 7 corresponding to 0.250, and all indexes between 30 and 7.

For $d_{free}$ and $N_{min}$ corresponding to a repetition pattern corresponding to each code rate in Table 9, refer to Table 10.

TABLE 10

| #rep | Rate | $i_{dx}$ | $d_{min}$ | $N_{min}$ |
|---|---|---|---|---|
| 0 | 0.5000 |  | 10 | 3850 |
| 1 | 0.4918 | 30 | 10 | 3131 |
| 2 | 0.4839 | 2 | 10 | 2478 |
| 3 | 0.4762 | 24 | 10 | 1941 |
| 4 | 0.4688 | 46 | 10 | 1463 |
| 5 | 0.4615 | 8 | 10 | 1086 |
| 6 | 0.4545 | 37 | 10 | 813 |
| 7 | 0.4478 | 54 | 10 | 596 |
| 8 | 0.4412 | 19 | 10 | 431 |
| 9 | 0.4348 | 50 | 10 | 293 |
| 10 | 0.4286 | 15 | 10 | 200 |
| 11 | 0.4225 | 40 | 10 | 129 |
| 12 | 0.4167 | 57 | 10 | 72 |
| 13 | 0.4110 | 27 | 10 | 36 |
| 14 | 0.4054 | 12 | 10 | 12 |
| 15 | 0.4000 | 44 | 11 | 536 |
| 16 | 0.3947 | 5 | 11 | 374 |
| 17 | 0.3896 | 38 | 11 | 231 |

TABLE 10-continued

| #rep | Rate | $i_{dx}$ | $d_{min}$ | $N_{min}$ |
|---|---|---|---|---|
| 18 | 0.3846 | 16 | 11 | 137 |
| 19 | 0.3797 | 49 | 11 | 68 |
| 20 | 0.3750 | 23 | 11 | 33 |
| 21 | 0.3704 | 6 | 11 | 11 |
| 22 | 0.3659 | 42 | 12 | 432 |
| 23 | 0.3614 | 35 | 12 | 264 |
| 24 | 0.3571 | 1 | 12 | 129 |
| 25 | 0.3529 | 28 | 12 | 69 |
| 26 | 0.3488 | 34 | 12 | 33 |
| 27 | 0.3448 | 9 | 13 | 669 |
| 28 | 0.3409 | 58 | 13 | 445 |
| 29 | 0.3371 | 20 | 13 | 268 |
| 30 | 0.3333 | 36 | 13 | 172 |
| 31 | 0.3297 | 10 | 13 | 94 |
| 32 | 0.3261 | 45 | 13 | 47 |
| 33 | 0.3226 | 21 | 13 | 11 |
| 34 | 0.3191 | 53 | 14 | 406 |
| 35 | 0.3158 | 32 | 14 | 238 |
| 36 | 0.3125 | 4 | 14 | 104 |
| 37 | 0.3093 | 26 | 14 | 56 |
| 38 | 0.3061 | 56 | 14 | 22 |
| 39 | 0.3030 | 0 | 15 | 518 |
| 40 | 0.3000 | 17 | 15 | 342 |
| 41 | 0.2970 | 41 | 15 | 186 |
| 42 | 0.2941 | 47 | 15 | 103 |
| 43 | 0.2913 | 11 | 15 | 34 |
| 44 | 0.2885 | 52 | 15 | 12 |
| 45 | 0.2857 | 33 | 16 | 501 |
| 46 | 0.2830 | 25 | 16 | 310 |
| 47 | 0.2804 | 3 | 16 | 175 |
| 48 | 0.2778 | 18 | 16 | 81 |
| 49 | 0.2752 | 48 | 16 | 24 |
| 50 | 0.2727 | 13 | 16 | 12 |
| 51 | 0.2703 | 39 | 17 | 369 |
| 52 | 0.2679 | 14 | 17 | 208 |
| 53 | 0.2655 | 55 | 17 | 82 |
| 54 | 0.2632 | 31 | 17 | 34 |
| 55 | 0.2609 | 59 | 18 | 649 |
| 56 | 0.2586 | 22 | 18 | 314 |
| 57 | 0.2564 | 51 | 18 | 118 |
| 58 | 0.2542 | 29 | 18 | 22 |
| 59 | 0.2521 | 43 | 19 | 568 |
| 60 | 0.25 | 7 | 20 | 3837 |
| 61 | 0.2479 | 32 | 20 | 3119 |
| 62 | 0.2459 | 4 | 20 | 2466 |
| 63 | 0.2439 | 26 | 20 | 1929 |
| 64 | 0.2419 | 48 | 20 | 1455 |
| 65 | 0.2400 | 10 | 20 | 1078 |
| 66 | 0.2381 | 39 | 20 | 805 |
| 67 | 0.2362 | 56 | 20 | 590 |
| 68 | 0.2344 | 21 | 20 | 426 |
| 69 | 0.2326 | 52 | 20 | 289 |
| 70 | 0.2308 | 17 | 20 | 196 |
| 71 | 0.2290 | 42 | 20 | 126 |
| 72 | 0.2273 | 59 | 20 | 71 |
| 73 | 0.2256 | 29 | 20 | 35 |
| 74 | 0.2239 | 14 | 20 | 12 |
| 75 | 0.2222 | 46 | 21 | 531 |
| 76 | 0.2206 | 7 | 21 | 372 |
| 77 | 0.2190 | 40 | 21 | 231 |
| 78 | 0.2174 | 18 | 21 | 137 |
| 79 | 0.2158 | 51 | 21 | 68 |
| 80 | 0.2143 | 25 | 21 | 11 |
| 81 | 0.2128 | 3 | 21 | 11 |
| 82 | 0.2113 | 8 | 22 | 437 |
| 83 | 0.2098 | 36 | 22 | 234 |
| 84 | 0.2083 | 30 | 22 | 114 |
| 85 | 0.2069 | 0 | 22 | 59 |
| 86 | 0.2055 | 43 | 22 | 23 |
| 87 | 0.2041 | 35 | 22 | 11 |
| 88 | 0.2027 | 12 | 23 | 349 |
| 89 | 0.2013 | 44 | 23 | 209 |
| 90 | 0.2000 | 16 | 23 | 116 |
| 91 | 0.1987 | 22 | 23 | 68 |
| 92 | 0.1974 | 55 | 23 | 24 |
| 93 | 0.1961 | 20 | 24 | 508 |
| 94 | 0.1948 | 50 | 24 | 326 |
| 95 | 0.1935 | 38 | 24 | 195 |
| 96 | 0.1923 | 11 | 24 | 93 |
| 97 | 0.1911 | 37 | 24 | 45 |
| 98 | 0.1899 | 54 | 24 | 12 |
| 99 | 0.1887 | 15 | 23 | 533 |
| 100 | 0.1875 | 47 | 25 | 349 |
| 101 | 0.1863 | 27 | 25 | 206 |
| 102 | 0.1852 | 56 | 25 | 107 |
| 103 | 0.1840 | 23 | 25 | 36 |
| 104 | 0.1829 | 34 | 26 | 911 |
| 105 | 0.1818 | 2 | 26 | 537 |
| 106 | 0.1807 | 9 | 26 | 321 |
| 107 | 0.1796 | 58 | 26 | 198 |
| 108 | 0.1786 | 28 | 26 | 90 |
| 109 | 0.1775 | 6 | 26 | 34 |
| 110 | 0.1765 | 49 | 27 | 595 |
| 111 | 0.1754 | 24 | 27 | 369 |
| 112 | 0.1744 | 31 | 27 | 237 |
| 113 | 0.1734 | 1 | 27 | 105 |
| 114 | 0.1724 | 45 | 27 | 45 |
| 115 | 0.1714 | 5 | 28 | 645 |
| 116 | 0.1705 | 19 | 28 | 397 |
| 117 | 0.1695 | 53 | 28 | 199 |
| 118 | 0.1685 | 33 | 28 | 67 |
| 119 | 0.1676 | 57 | 29 | 984 |
| 120 | 0.1667 | 13 | 29 | 487 |
| 121 | 0.1657 | 41 | 30 | 3139 |
| 122 | 0.1648 | 28 | 30 | 2448 |
| 123 | 0.1639 | 24 | 30 | 1924 |
| 124 | 0.1630 | 2 | 30 | 1451 |
| 125 | 0.1622 | 22 | 30 | 1096 |
| 126 | 0.1613 | 50 | 30 | 775 |
| 127 | 0.1604 | 18 | 30 | 556 |
| 128 | 0.1596 | 45 | 30 | 405 |
| 129 | 0.1587 | 10 | 30 | 290 |
| 130 | 0.1579 | 26 | 30 | 195 |
| 131 | 0.1571 | 49 | 30 | 114 |
| 132 | 0.1563 | 59 | 30 | 59 |
| 133 | 0.1554 | 25 | 30 | 23 |
| 134 | 0.1546 | 52 | 30 | 11 |
| 135 | 0.1538 | 6 | 31 | 525 |
| 136 | 0.1531 | 37 | 31 | 345 |
| 137 | 0.1523 | 17 | 31 | 217 |
| 138 | 0.1515 | 9 | 31 | 128 |
| 139 | 0.1508 | 30 | 31 | 80 |
| 140 | 0.1500 | 42 | 31 | 34 |
| 141 | 0.1493 | 57 | 31 | 12 |
| 142 | 0.1485 | 38 | 32 | 376 |
| 143 | 0.1478 | 14 | 32 | 124 |
| 144 | 0.1471 | 46 | 32 | 124 |
| 145 | 0.1463 | 1 | 32 | 58 |
| 146 | 0.1456 | 21 | 32 | 23 |
| 147 | 0.1449 | 33 | 32 | 11 |
| 148 | 0.1442 | 8 | 33 | 323 |
| 149 | 0.1435 | 54 | 33 | 150 |
| 150 | 0.1429 | 23 | 33 | 78 |
| 151 | 0.1422 | 0 | 33 | 23 |
| 152 | 0.1415 | 41 | 33 | 11 |
| 153 | 0.1408 | 13 | 34 | 439 |
| 154 | 0.1402 | 20 | 34 | 301 |
| 155 | 0.1395 | 53 | 34 | 172 |
| 156 | 0.1389 | 48 | 34 | 103 |
| 157 | 0.1382 | 4 | 34 | 48 |
| 158 | 0.1376 | 32 | 35 | 699 |
| 159 | 0.1370 | 24 | 35 | 438 |
| 160 | 0.1364 | 12 | 35 | 290 |
| 161 | 0.1357 | 44 | 35 | 150 |
| 162 | 0.1351 | 40 | 35 | 90 |
| 163 | 0.1345 | 5 | 35 | 35 |
| 164 | 0.1339 | 16 | 35 | 12 |
| 165 | 0.1333 | 36 | 36 | 241 |
| 166 | 0.1327 | 58 | 36 | 130 |
| 167 | 0.1322 | 31 | 36 | 82 |
| 168 | 0.1316 | 39 | 36 | 46 |
| 169 | 0.1310 | 7 | 36 | 12 |
| 170 | 0.1304 | 27 | 37 | 473 |
| 171 | 0.1299 | 19 | 37 | 311 |
| 172 | 0.1293 | 47 | 37 | 149 |
| 173 | 0.1288 | 51 | 37 | 58 |

TABLE 10-continued

| #rep | Rate | $i_{dx}$ | $d_{min}$ | $N_{min}$ |
|---|---|---|---|---|
| 174 | 0.1282 | 11 | 38 | 694 |
| 175 | 0.1277 | 35 | 38 | 454 |
| 176 | 0.1271 | 3 | 38 | 234 |
| 177 | 0.1266 | 23 | 38 | 104 |
| 178 | 0.1261 | 55 | 39 | 1165 |
| 179 | 0.1255 | 43 | 39 | 576 |

In Table 10, "#rep" indicates that a type of rate matching is repetition (repetition). In addition, an element in a column at which "#rep" is located indicates a quantity of repetition locations. $i_{dx}$ indicates an index of a repetition location.

For example, when the code rate is 1/2 (which corresponds to 0.5000 in Table 9), no repetition location corresponds to the code rate 1/2. It indicates that when the transmit device performs convolutional encoding on the information bit sequence, to obtain the original code rate 1/2, there is no repetition location. In other words, when sending a codeword sequence, the transmit device does not perform the repetition operation.

When a code rate is 0.2521, an element in the column at which "#rep" is located is 59, and it indicates that there are 59 repetition locations, specifically, an index "43" of a repetition location corresponding to 0.2521 and all indexes before the index "43" of the repetition location in Table 10. In other words, a repetition location index set is {30, 2, 24, 46, 8, 37, 54, . . . , 51, 29, 43}.

If a lower code rate, for example, 1/4 needs to be obtained, a repetition location set is first 60 indexes {30, 2, 24, 46, . . . , 7} in Table 9, specifically, a set including an index 30 corresponding to 0.5, an index 7 corresponding to 0.250, and all indexes between 30 and 7.

The foregoing describes the convolutional code rate matching method provided in this disclosure in detail. In the IR HARQ mechanism, as a quantity of retransmission times increases, more incremental redundant bits may be obtained, so that a code rate continuously decreases. This improves a decoding success rate of the receive device, and improves decoding performance.

Figure 6:
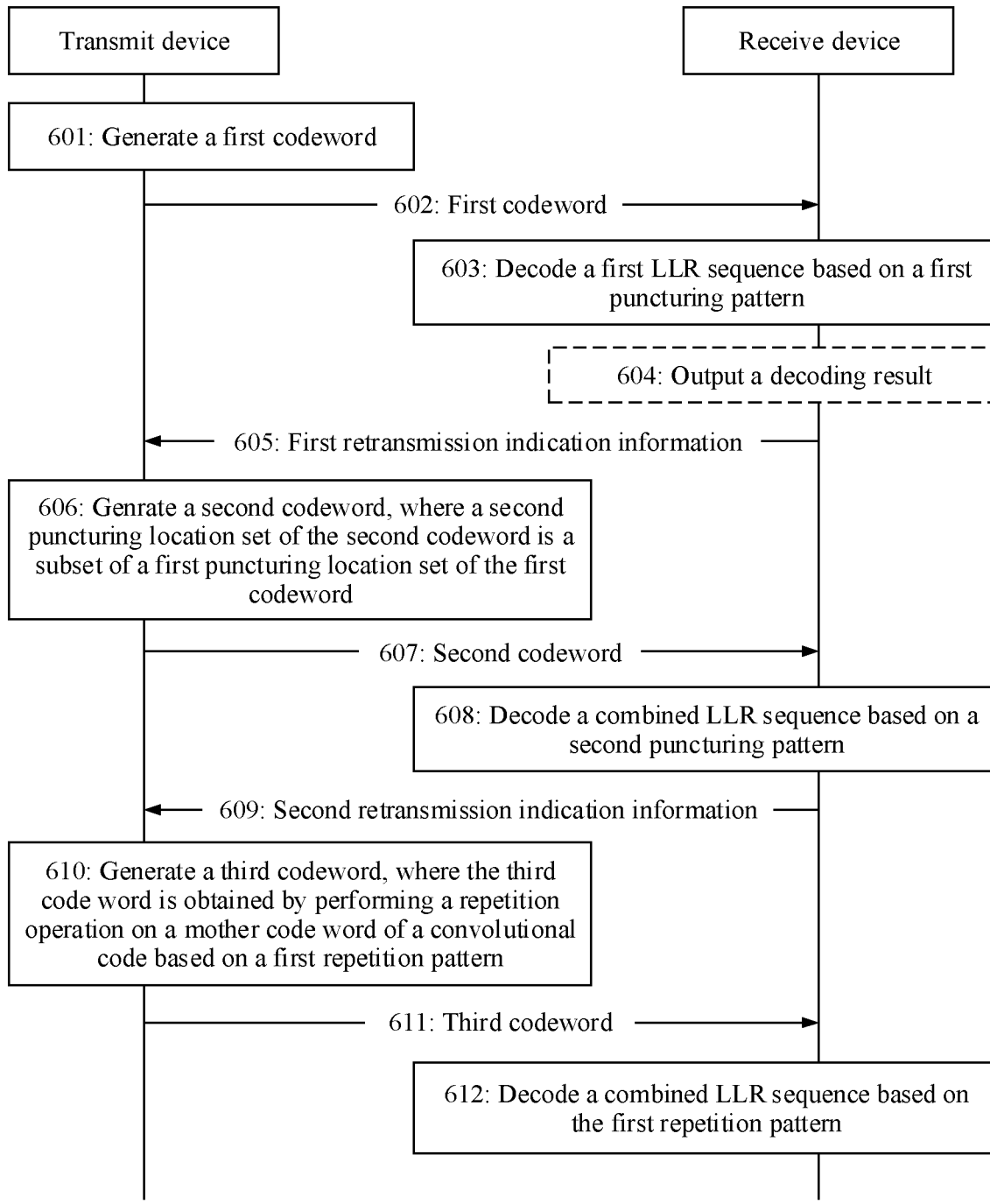
FIG. 6 is an example of a flowchart of encoding and decoding a convolutional code according to this disclosure.

FIG. 6 is a flowchart of encoding and decoding a convolutional code according to this disclosure.

Optionally, in the flowchart shown in FIG. 6, an operation or processing may be performed by a receive device, or a chip or a circuit system disposed in a receive device. The circuit system may be, for example, an integrated circuit or a logic circuit. For example, the chip may be a system on a chip (system on a chip, SoC) chip, a baseband modem (modem) chip, or the like. This is not limited herein. The following uses a receive device as an example for description.

The receive device may be a terminal device or a network device. It should be understood that the receive device in embodiments of this disclosure is also an decoding device. For example, in uplink transmission, a transmit device is a terminal device, and the receive device is a network device. In downlink transmission, a transmit device is a network device, and the receive device is a terminal device.

601: A transmit device generates a first codeword at a first code rate.

In the following, a puncturing pattern of the first codeword is referred to as a first puncturing pattern, and the first puncturing pattern includes a first puncturing location set.

The foregoing puncturing solution in Table 1 is used as an example. It is assumed that a grid period P of a convolutional code is equal to 30 and a codeword bit period is equal to 60.

If the first code rate is 5/6, the first puncturing location set is {59, 31, 11, 39, 51, 19, 3, 43, 23, 15, 47, 55, 27, 7, 35, 0, 36, 8, 32, 53, 21, 4, 45, 16}.

602: The transmit device sends the first codeword.

The receive device receives a first channel receive sequence from the transmit device.

For step 601 and step 602, refer to step 510 and step 520. Details are not described again.

603: The receive device determines a first LLR sequence corresponding to the first channel receive sequence, and decodes the first LLR by using the first puncturing pattern.

In step 603, the receive device decodes the first LLR sequence by using a same puncturing pattern as the transmit device.

604: The receive device outputs a decoding result if the first LLR sequence is successfully decoded.

Optionally, if the receive device incorrectly performs decoding, the receive device sends retransmission indication information to the transmit device, to request the transmit device to perform retransmission, as shown in step 605 to step 611.

605: The receive device sends first retransmission indication information to the transmit device. The transmit device receives the first retransmission indication information from the receive device.

606: The transmit device generates a second codeword at a second code rate.

A puncturing pattern (which is referred to as a second puncturing pattern in the following) of the second codeword is obtained based on the first puncturing pattern of the first codeword, the second puncturing pattern includes a second puncturing location set, and the second puncturing location set is a subset of the first puncturing location set.

It is assumed that the second code rate is 3/4, and the second puncturing location set is {59, 31, 11, 39, 51, 19, 3, 43, 23, 15, 47, 55, 27, 7, 35, 0, 36, 8, 32, 53}. It can be learned that, in comparison with the first codeword, codeword bits whose indexes are 21, 4, 45, and 16 of the second codeword are not punctured, and may be used to send a redundant bit.

Compared with the first code rate used by the transmit device to send the first codeword, the second code rate used by the transmit device to send the second codeword is decreased, to improve a decoding success rate of the receive device.

607: The transmit device sends the second codeword.

The receive device receives a second channel receive sequence from the transmit device.

608: The receive device determines a second LLR sequence corresponding to the second channel receive sequence, and decodes a combined LLR sequence by using the second puncturing pattern.

The combined LLR sequence is obtained by combining the first LLR sequence and the second LLR sequence. Specifically, the first LLR sequence and the second LLR sequence are combined by bit. LLR values at a same location index of the second LLR sequence and the first LLR sequence are combined, and LLR values at different index locations remain unchanged.

For example, a length of the first LLR sequence is 6, index locations are 1, 2, 3, 4, and 5, and LLR values corresponding to the index locations are respectively $LLR_{11}$, $LLR_{12}$, $LLR_{13}$, $LLR_{14}$, and $LLR_{15}$. A length of the second LLR sequence is 6, index locations are 3, 4, 5, 6, and 7, and LLR values corresponding to the index locations are respectively $LLR_{23}$, $LLR_{24}$, $LLR_{25}$, $LLR_{26}$, and $LLR_{27}$. Therefore, the combined LLR sequence is {$LLR_{11}$, $LLR_{12}$, +$LLR_{23}$ $LLR_{14}+LLR_{24}$, $LLR_{15}+LLR_{25}$, $LLR_{26}$, $LLR_{27}$}, where addition of LLR values is binary addition.

Further, if the receive device successfully decodes the combined LLR sequence based on the second puncturing pattern, the receive device outputs a decoding result. If the receive device unsuccessfully decodes the combined LLR sequence based on the second puncturing pattern, retransmission is performed. A similar process is performed until decoding succeeds. Alternatively, until a set maximum quantity of retransmission times is reached, the receive device determines that decoding fails.

If the combined LLR sequence is unsuccessfully decoded, and the maximum quantity of retransmission times is not reached, the receive device requests the transmit device to perform retransmission for a second time.

609: The receive device sends second retransmission indication information to the transmit device.

The transmit device receives the second retransmission indication information from the receive device.

610: The transmit device generates a third codeword at a third code rate.

In an implementation, a code rate is decreased by using a puncturing solution, and the transmit device may use specific implementation in the solution 1 or the solution 2. If the third code rate is lower than 3/4 and greater than 1/2 a third puncturing location set of the third codeword is a subset of the second puncturing location set. For example, the third code rate is 0.6, 0.536, or the like, and a third puncturing location corresponding to the third code rate may be determined according to Table 1.

In another implementation, if the transmit device uses the repetition solution in the solution 3, the third code rate is lower than 3/4, and may be lower than 1/2.

Table 9 is used as an example. It is assumed that the third code rate is 0.25, a first repetition location corresponding to the third codeword includes first 60 indexes in the $i_{dx}$ column in Table 9, and a repetition location set is {30, 2, 24, 46, . . . , 51, 29, 43, 7}.

611: The transmit device sends the third codeword.

The receive device receives a third channel receive sequence from the transmit device.

612: The receive device determines a third LLR sequence corresponding to the third channel receive sequence, and decodes a combined LLR sequence by using a first repetition pattern.

In step 612, the combined sequence is obtained by combining the first LLR sequence, the second LLR sequence, and the third LLR sequence. The first LLR sequence, the second LLR sequence, and the third LLR sequence are combined by "bit".

For example, a length of the third LLR sequence is 6, index locations are 1, 2, 5, 6, and 8, and LLR values corresponding to the index locations are respectively $LLR_{31}$, $LLR_{32}$, $LLR_{35}$, $LLR_{36}$, and $LLR_{38}$. Then, the combined LLR sequence is {$LLR_{11}+LLR_{31}$, $LLR_{12}+LLR_{32}$, $LLR_{13}+LLR_{23}$, $LLR_{14}+LLR_{24}$, $LLR_{15}+LLR_{25}+LLR_{35}$, $LLR_{26}+LLR_{36}$, $LLR_{27}$, $LLR_{38}$}, where addition of LLR values is binary addition.

A similar process is performed until the receive device successfully performs decoding or the maximum quantity of retransmission times is reached.

The foregoing describes embodiments of this disclosure in detail.

Figure 7:
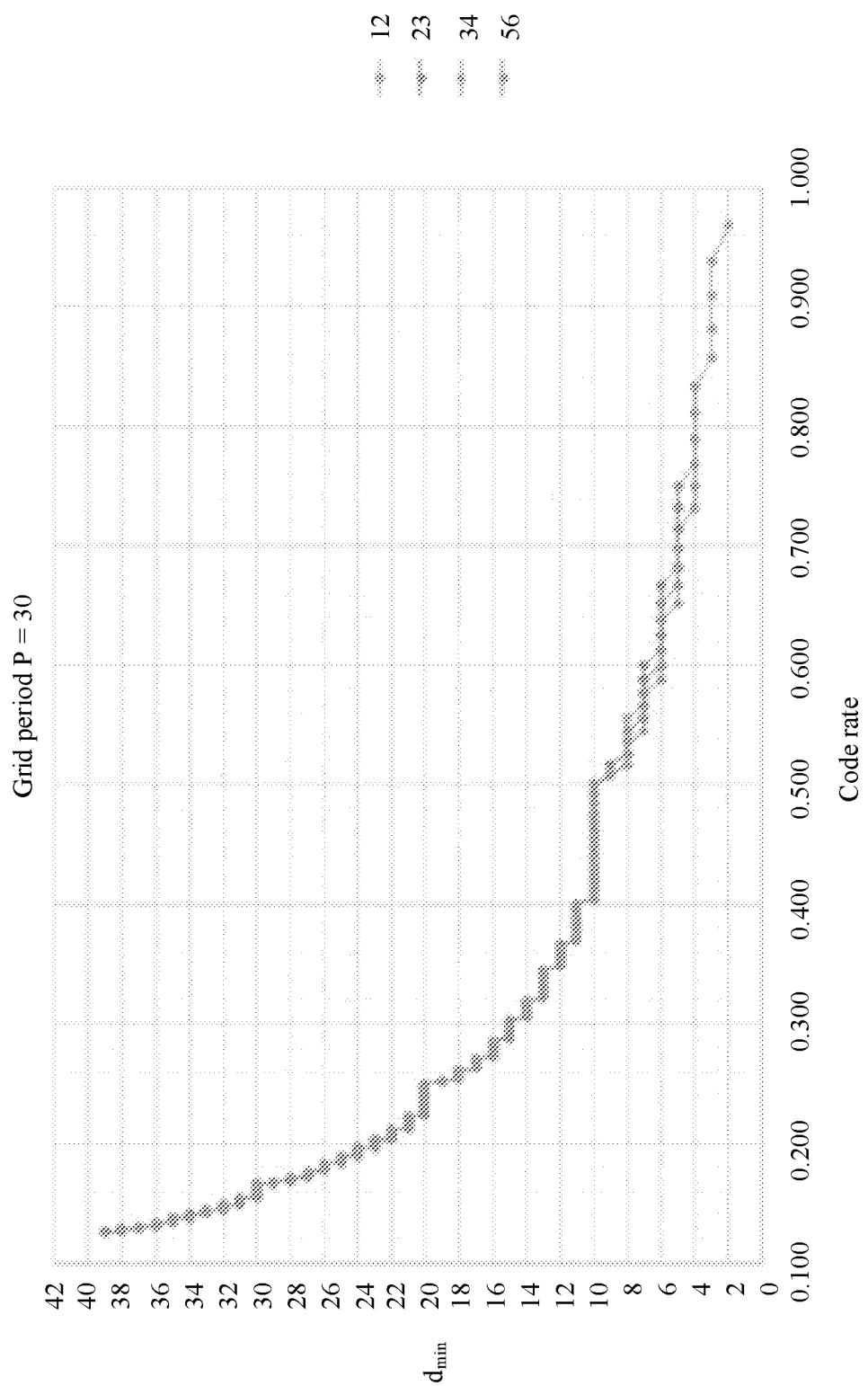
FIG. 7 shows a minimum free distance at each code rate in embodiments.

FIG. 7 shows a minimum free distance at each code rate in embodiments. A curve at a code rate of 1/2 corresponds to the puncturing pattern in the solution 1, curves at code rates of 2/3, 1/2, and 5/6 correspond to the puncturing pattern in the solution 2, and a curve at a code rate lower than 1/2 corresponds to the repetition pattern in the solution 3.

Figure 8:
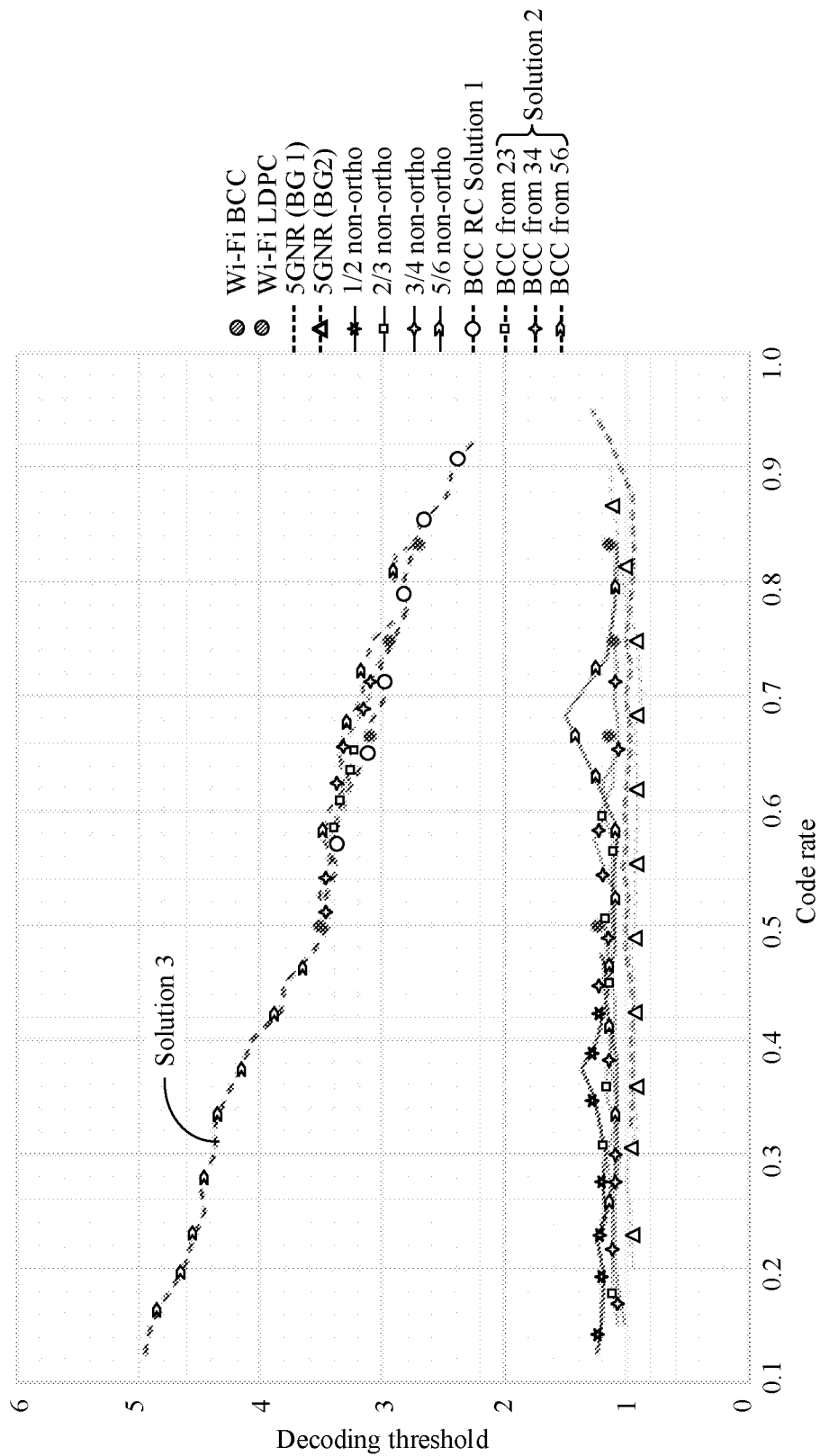
FIG. 8 shows error control performance of a rate compatibility solution for BCCs at code rates according to this disclosure.

FIG. 8 shows error control performance of a rate compatibility solution for BCCs at code rates according to this disclosure. The vertical coordinate is a distance between a channel capacity of a corresponding rate and a signal-to-noise ratio (signal-to-noise ratio, SNR) required when a frame error rate of a BCC at a code rate reaches $10^{-2}$. A smaller distance indicates better performance.

As shown in FIG. 8, one curve labeled the solution 1 indicates error control performance achieved by using the puncturing solution in the solution 1, and three curves labeled the solution 2 indicate error control performance achieved by using the puncturing solution in the solution 2. When a code rate is lower than 1/2, the curve labeled the solution 3 indicates error control performance achieved by using the repetition solution in the solution 3. It can be learned that distances, obtained by using the puncturing solution or the repetition solution provided in embodiments of this disclosure, between a channel capacity and SNRs required when FERs corresponding to code rates reach $10^{-2}$ are close, and performance is good.

In FIG. 8, a throughput rate of a 5G LDPC code is shown as a curve corresponding to 5G NR (BG 1) or 5G NR (BG 2). A BG 1 indicates that a cyclic shift matrix of a basic matrix of an LDPC code uses a BG 1 matrix, and a BG 2 indicates that a cyclic shift matrix of a basic matrix of an LDPC code uses a BG 2 matrix.

It should be understood that BG is a base graph (base graph), and may be used to indicate a cyclic shift matrix of a basic matrix.

A channel in FIG. 8 may be a binary input additive white Gaussian noise (binary input additive white Gaussian noise, BAWAN) channel.

In addition, "non-ortho" is short for non-orthogonal (non-orthogonal).

The foregoing describes embodiments of this disclosure in detail. The following describes a communication apparatus in this disclosure.

Figure 9:
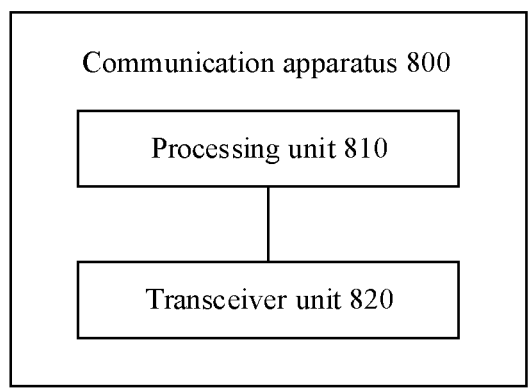
FIG. 9 is a schematic block diagram of a communication apparatus 800 according to this disclosure.

FIG. 9 is a schematic block diagram of a communication apparatus 800 according to this disclosure. As shown in FIG. 9, the communication apparatus 800 includes a processing unit 810 and a transceiver unit 820.

The processing unit 810 is configured to generate a second codeword, where a puncturing pattern of the second codeword is generated based on a puncturing pattern of a first codeword, the puncturing pattern of the first codeword includes a first puncturing location set, the puncturing pattern of the second codeword includes a second puncturing location set, and the second puncturing location set is a subset of the first puncturing location set.

The transceiver unit 820 is further configured to send the second codeword.

Optionally, in an embodiment, the first codeword corresponds to a first code rate, the second codeword corresponds to a second code rate, either the first code rate or the second code rate is a code rate in Table A, the first puncturing location set includes a first puncturing location corresponding to the first code rate in Table A and all puncturing locations located before the first puncturing location in Table A, and the second puncturing location set includes a second puncturing location corresponding to the second code rate in Table A and all puncturing locations located before the second puncturing location in Table A. For Table A, refer to description of the method embodiment.

Optionally, in an embodiment, the first code rate is 5/6, the first puncturing location set is {59, 31, 11, 39, 51, 19, 3, 43, 23, 15, 47, 55, 27, 7, 35, 0, 36, 8, 32, 53, 21, 4, 45, 16}, the second code rate is 3/4, and the second puncturing location set is {59, 31, 11, 39, 51, 19, 3, 43, 23, 15, 47, 55, 27, 7, 35, 0, 36, 8, 32, 53};

the first code rate is 5/6, the first puncturing location set is {59, 31, 11, 39, 51, 19, 3, 43, 23, 15, 47, 55, 27, 7, 35, 0, 36, 8, 32, 53, 21, 4, 45, 16}, the second code rate is 2/3, and the second puncturing location set is {59, 31, 11, 39, 51, 19, 3, 43, 23, 15, 47, 55, 27, 7, 35}; or the first code rate is 3/4, the first puncturing location set is {59, 31, 11, 39, 51, 19, 3, 43, 23, 15, 47, 55, 27, 7, 35, 0, 36, 8, 32, 53}, the second code rate is 2/3, and the second puncturing location set is {59, 31, 11, 39, 51, 19, 3, 43, 23, 15, 47, 55, 27, 7, 35}.

Optionally, in an embodiment, before sending the second codeword, the processing unit 810 is further configured to perform convolutional encoding on an information bit sequence, to obtain a mother codeword at a code rate of 1/2; and perform rate matching on the mother codeword based on a puncturing pattern corresponding to the first puncturing location set, to obtain the first codeword.

The transceiver unit 820 is further configured to output the first codeword.

Optionally, in an embodiment, the first codeword corresponds to a first code rate, the second codeword corresponds to a second code rate, either the first code rate or the second code rate is a code rate in Table B, the first puncturing location set includes a first puncturing location corresponding to the first code rate in Table B and all puncturing locations located before the first puncturing location in Table B, and the second puncturing location set includes a second puncturing location corresponding to the second code rate in Table B and all puncturing locations located before the second puncturing location in Table B. For Table B, refer to description of the method embodiment.

Optionally, in an embodiment, the first codeword corresponds to a first code rate, the second codeword corresponds to a second code rate, either the first code rate or the second code rate is a code rate in Table C, the first puncturing location set includes a first puncturing location corresponding to the first code rate in Table C and all puncturing locations located before the first puncturing location in Table C, and the second puncturing location set includes a second puncturing location corresponding to the second code rate in Table C and all puncturing locations located before the second puncturing location in Table C. For Table C, refer to description of the method embodiment.

Optionally, in an embodiment, the first codeword corresponds to a first code rate, the second codeword corresponds to a second code rate, either the first code rate or the second code rate is a code rate in Table D, the first puncturing location set includes a first puncturing location corresponding to the first code rate in Table D and all puncturing locations located before the first puncturing location in Table D, and the second puncturing location set includes a second puncturing location corresponding to the second code rate in Table D and all puncturing locations located before the second puncturing location in Table D. For Table D, refer to description of the method embodiment.

Optionally, in an embodiment, the transceiver unit 820 is further configured to output a third codeword at a third code rate, where the third codeword is obtained by performing a repetition operation on the mother codeword based on a repetition pattern, the mother codeword is obtained by performing convolutional encoding on the information bit sequence, the third code rate is a code rate in Table E, and a repetition location of the repetition operation is a first repetition location corresponding to the third code rate in Table E and all repetition locations located before the first repetition location in Table E. For Table E, refer to description of the method embodiment.

Optionally, the transceiver unit 820 may alternatively be replaced with a sending unit or a receiving unit. For example, when executing a sending action, the transceiver unit 820 may be replaced with the sending unit. When executing a receiving action, the transceiver unit 820 may be replaced with the receiving unit.

Optionally, the communication apparatus 800 may be a transmit device, or a component, a module, or the like that is inside a transmit device and that implements functions of the method embodiments.

In an implementation, the communication apparatus 800 is the transmit device in the foregoing method embodiments, and the communication apparatus 800 may have any function of the transmit device in the method embodiments. In this case, the processing unit 810 may be a processor, and the transceiver unit 820 may be a transceiver. The transceiver may specifically include a receiver and a transmitter. The receiver is configured to execute a receiving function, and the transmitter is configured to execute a transmitting function.

Optionally, in another implementation, the communication apparatus 800 may be a circuit system in the transmit device. In this case, the processing unit 810 may be a chip, a logic circuit, an integrated circuit, a processing circuit, a system on a chip (system on a chip, SoC) chip, or the like. The transceiver unit 820 may be a communication interface, and the communication interface may be an interface circuit, an input/output interface, or the like.

In the foregoing embodiments, functions of the processing unit 810 may be implemented by hardware, or may be implemented by hardware executing corresponding software.

For example, the processing unit 810 may include one or more processors. The one or more processors are configured to read and execute a computer program or instructions stored in a memory, to enable the communication apparatus 800 to perform operations and/or processing performed by the transmit device in the method embodiments. The memory is located outside the one or more processors.

Further, the processing unit 810 may further include one or more memories. The one or more processors are connected to the one or more memories by using a circuit/electric line. The one or more processors can read a computer program or instructions stored in the one or more memories, to enable the communication apparatus 800 to perform operations and/or processing performed by the transmit device in the method embodiments of this disclosure.

For another example, the processing unit 810 is a processor, and the transceiver unit 820 may be an interface circuit. The interface circuit is configured to receive computer code or instructions, and transmit the computer code or instructions to the processor. The processor executes the computer code or the instructions, to enable the communication apparatus 800 to perform operations and/or processing performed by the transmit device in the method embodiments of this disclosure.

Figure 10:
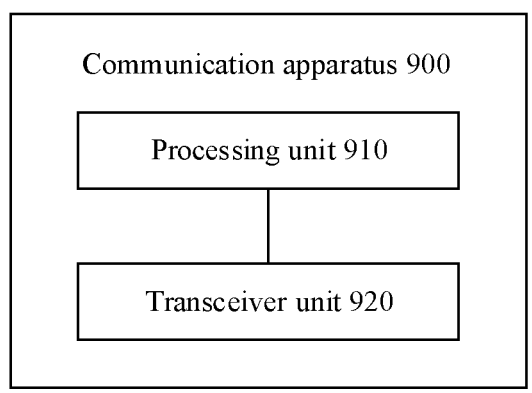
FIG. 10 is a schematic block diagram of a communication apparatus 900 according to this disclosure.

FIG. 10 is a schematic block diagram of a communication apparatus 900 according to this disclosure. As shown in FIG. 10, the communication apparatus 900 includes a processing unit 910 and a transceiver unit 920.

The transceiver unit 920 is configured to receive a second channel receive sequence from a transmit device.

The processing unit 910 decodes a combined LLR sequence based on a second puncturing pattern, where the combined LLR sequence is obtained by combining a first LLR sequence and a second LLR sequence, the first LLR sequence corresponds to a first channel receive sequence, the first LLR sequence corresponds to a first codeword of the transmit device, the second LLR sequence corresponds to a second codeword of the transmit device, the second puncturing pattern of the second codeword includes a second puncturing location set, a first puncturing pattern of the first codeword includes a first puncturing location set, and the second puncturing location set is a subset of the first puncturing location set.

Optionally, in an embodiment, the first codeword corresponds to a first code rate, the second codeword corresponds to a second code rate, either the first code rate or the second code rate is a code rate in Table A, the first puncturing location set includes a first puncturing location corresponding to the first code rate in Table A and all puncturing locations located before the first puncturing location in Table A, and the second puncturing location set includes a second puncturing location corresponding to the second code rate in Table A and all puncturing locations located before the second puncturing location in Table A. For Table A, refer to description of the method embodiment.

Optionally, in an embodiment, the first code rate is 5/6, the first puncturing location set is {59, 31, 11, 39, 51, 19, 3, 43, 23, 15, 47, 55, 27, 7, 35, 0, 36, 8, 32, 53, 21, 4, 45, 16}, the second code rate is 3/4, and the second puncturing location set is {59, 31, 11, 39, 51, 19, 3, 43, 23, 15, 47, 55, 27, 7, 35, 0, 36, 8, 32, 53};

the first code rate is 5/6, the first puncturing location set is {59, 31, 11, 39, 51, 19, 3, 43, 23, 15, 47, 55, 27, 7, 35, 0, 36, 8, 32, 53, 21, 4, 45, 16}, the second code rate is 2/3, and the second puncturing location set is {59, 31, 11, 39, 51, 19, 3, 43, 23, 15, 47, 55, 27, 7, 35}; or the first code rate is 3/4, the first puncturing location set is {59, 31, 11, 39, 51, 19, 3, 43, 23, 15, 47, 55, 27, 7, 35, 0, 36, 8, 32, 53}, the second code rate is 2/3, and the second puncturing location set is {59, 31, 11, 39, 51, 19, 3, 43, 23, 15, 47, 55, 27, 7, 35}.

Optionally, in an embodiment, the processing unit 910 is further configured to perform convolutional encoding on an information bit sequence, to obtain a mother codeword at a code rate of 1/2; and perform rate matching on the mother codeword based on a puncturing pattern corresponding to the first puncturing location set, to obtain the first codeword.

The transceiver unit 920 is further configured to send the first codeword.

Optionally, in an embodiment, the first codeword corresponds to a first code rate, the second codeword corresponds to a second code rate, either the first code rate or the second code rate is a code rate in Table B, the first puncturing location set includes a first puncturing location corresponding to the first code rate in Table B and all puncturing locations located before the first puncturing location in Table B, and the second puncturing location set includes a second puncturing location corresponding to the second code rate in Table B and all puncturing locations located before the second puncturing location in Table B. For Table B, refer to description of the method embodiment.

Optionally, in an embodiment, the first codeword corresponds to a first code rate, the second codeword corresponds to a second code rate, either the first code rate or the second code rate is a code rate in Table C, the first puncturing location set includes a first puncturing location corresponding to the first code rate in Table C and all puncturing locations located before the first puncturing location in Table C, and the second puncturing location set includes a second puncturing location corresponding to the second code rate in Table C and all puncturing locations located before the second puncturing location in Table C. For Table C, refer to description of the method embodiment.

Optionally, in an embodiment, the first codeword corresponds to a first code rate, the second codeword corresponds to a second code rate, either the first code rate or the second code rate is a code rate in Table D, the first puncturing location set includes a first puncturing location corresponding to the first code rate in Table D and all puncturing locations located before the first puncturing location in Table D, and the second puncturing location set includes a second puncturing location corresponding to the second code rate in Table D and all puncturing locations located before the second puncturing location in Table D. For Table D, refer to description of the method embodiment.

Optionally, the transceiver unit 920 is further configured to output a decoding result when the processing unit 910 successfully decodes the combined LLR sequence.

Optionally, in an embodiment, the transceiver unit 920 is further configured to: when the processing unit 910 unsuccessfully decodes the first LLR sequence, send retransmission indication information, and receive the second channel receive sequence from the transmit device.

Optionally, in some embodiments, the processing unit 910 is further configured to generate a third codeword at a third code rate, where the third codeword is obtained by performing a repetition operation on the mother codeword based on a repetition pattern, the mother codeword is obtained by performing convolutional encoding on the information bit sequence, the third code rate is a code rate in Table E, and a repetition location of the repetition operation is a first repetition location corresponding to the third code rate in Table E and all repetition locations located before the first repetition location in Table E. For Table E, refer to description of the method embodiment.

In addition, the transceiver unit 920 is further configured to send the third codeword.

Optionally, the transceiver unit 920 may alternatively be replaced with a sending unit or a receiving unit. For example, when executing a sending action, the transceiver unit 920 may be replaced with the sending unit. When executing a receiving action, the transceiver unit 920 may be replaced with the receiving unit.

Optionally, the communication apparatus 900 may be a receive device, or a component, a module, or the like that is inside a receive device and that implements functions of the method embodiments.

In an implementation, the communication apparatus 900 is the receive device in the foregoing method embodiments, and the communication apparatus 900 may have any function of the receive device in the method embodiments. In this case, the processing unit 910 may be a processor, and the transceiver unit 920 may be a transceiver. The transceiver may specifically include a receiver and a transmitter. The receiver is configured to execute a receiving function, and the transmitter is configured to execute a transmitting function.

Optionally, in another implementation, the communication apparatus 900 may be a circuit system in the receive device. In this case, the processing unit 910 may be a chip, a logic circuit, an integrated circuit, a processing circuit, a system on a chip (system on a chip, SoC) chip, or the like. The transceiver unit 920 may be a communication interface, and the communication interface may be an interface circuit, an input/output interface, or the like.

In the foregoing embodiments, functions of the processing unit 910 may be implemented by hardware, or may be implemented by hardware executing corresponding software.

For example, the processing unit 910 may include one or more processors. The one or more processors are configured to read and execute a computer program or instructions stored in a memory, to enable the communication apparatus 900 to perform operations and/or processing performed by the receive device in the method embodiments. The memory is located outside the one or more processors.

Further, the processing unit 910 may further include one or more memories. The one or more processors are connected to the one or more memories by using a circuit/electric line. The one or more processors can read a computer program or instructions stored in the one or more memories, to enable the communication apparatus 900 to perform operations and/or processing performed by the transmit device in the method embodiments of this disclosure.

For another example, the processing unit 910 is a processor, and the transceiver unit 920 may be an interface circuit. The interface circuit is configured to receive computer code or instructions, and transmit the computer code or instructions to the processor. The processor executes the computer code or the instructions, to enable the communication apparatus 900 to perform operations and/or processing performed by the receive device in the method embodiments of this disclosure.

Optionally, the memory and the processor in the foregoing apparatus embodiments may be physically independent units, or the memory and the processor may be integrated together.

In addition, this disclosure further provides a computer-readable storage medium. The computer-readable storage medium stores computer instructions. When the computer instructions are run on a computer, the computer is enabled to perform operations and/or processing performed by the transmit device in the convolutional code rate matching method in embodiments of this disclosure.

This disclosure further provides a computer-readable storage medium. The computer-readable storage medium stores computer instructions. When the computer instructions are run on a computer, the computer is enabled to perform operations and/or processing performed by the receive device in the convolutional code rate matching method in embodiments of this disclosure.

This disclosure further provides a computer program product. The computer program product includes computer code or instructions, and when the computer code or the instructions is/are run on a computer, the convolutional code rate matching method in embodiments of this disclosure is implemented.

This disclosure further provides a computer program product. The computer program product includes computer code or instructions, and when the computer code or the instructions is/are run on a computer, the convolutional code rate matching method in embodiments of this disclosure is implemented.

This disclosure further provides a communication apparatus, including a processor and an interface circuit. The interface circuit is configured to receive computer code or instructions, and transmit the computer code or instructions to the processor. The processor is configured to run the computer code or instructions, to enable the communication apparatus to perform operations and/or processing performed by the transmit device in the convolutional code rate matching method in this disclosure.

This disclosure further provides a communication apparatus, including a processor and an interface circuit. The interface circuit is configured to receive computer code or instructions, and transmit the computer code or instructions to the processor. The processor is configured to run the computer code or instructions, to enable the communication apparatus to perform operations and/or processing performed by the receive device in the convolutional code rate matching method in this disclosure.

This disclosure further provides a chip. The chip includes one or more processors. The one or more processors are configured to execute a computer program stored in a memory, to perform operations and/or processing performed by the transmit device in any method embodiment. The memory is disposed independently of the chip.

Further, the chip may further include one or more communication interfaces. The one or more communication interfaces may be an input/output interface, an interface circuit, or the like. The chip may further include one or more memories.

This disclosure further provides a chip. The chip includes one or more processors. The one or more processors are configured to execute a computer program stored in a memory, to perform operations and/or processing performed by the receive device in any method embodiment. The memory is disposed independently of the chip.

Further, the chip may further include one or more communication interfaces. The one or more communication interfaces may be an input/output interface, an interface circuit, or the like. The chip may further include one or more memories.

This disclosure further provides a wireless communication system, including the transmit device and the receive device in embodiments of this disclosure. Optionally, one of the transmit device and the receive device is a network device (for example, a base station), and the other is a terminal device.

The processor in embodiments of this disclosure may be an integrated circuit chip, and has a signal processing capability. In an implementation process, steps in the foregoing method embodiments can be implemented by using a hardware integrated logical circuit in the processor, or by using instructions in a form of software. The processor may be a general-purpose processor, a digital signal processor (digital signal processor, DSP), an application-specific integrated circuit (application-specific integrated circuit, ASIC), a field programmable gate array (field programmable gate array, FPGA) or another programmable logic device, a discrete gate or a transistor logic device, or a discrete hardware component. The general-purpose processor may be a microprocessor, or the processor may be any conventional processor or the like. The steps of the methods disclosed in the embodiments of this disclosure may be directly executed and completed by using a hardware encoding processor, or may be executed and completed by using a combination of hardware and software modules in an encoding processor. The software module may be located in a mature storage medium in the art, such as a random access memory, a flash memory, a read-only memory, a programmable read-only memory, an electrically erasable programmable memory, or a register. The storage medium is located in a memory, and the processor reads information in the memory and completes the steps in the foregoing methods in combination with hardware of the processor.

The memory in the embodiments of this disclosure may be a volatile memory or a nonvolatile memory, or may include a volatile memory and a nonvolatile memory. The nonvolatile memory may be a read-only memory (read-only memory, ROM), a programmable read-only memory (programmable ROM, PROM), an erasable programmable read-only memory (erasable PROM, EPROM), an electrically erasable programmable read-only memory (electrically EPROM, EEPROM), or a flash memory. The volatile memory may be a random access memory (random access memory, RAM), used as an external cache. Through examples but not limitative description, RAMs in many forms are available, for example, a static random access memory (static RAM, SRAM), a dynamic random access memory (dynamic RAM, DRAM), a synchronous dynamic random access memory (synchronous DRAM, SDRAM), a double data rate synchronous dynamic random access memory (double data rate SDRAM, DDR SDRAM), an enhanced synchronous dynamic random access memory (enhanced SDRAM, ESDRAM), a synchlink dynamic random access memory (synchlink DRAM, SLDRAM), and a direct rambus random access memory (direct rambus RAM, DRRAM). It should be noted that the memory in the system and the method described in this specification is intended to include, but not limited to, these memories and any memory of another proper type.

The terms such as "unit", and "system" used in this specification are used to indicate computer-related entities, hardware, firmware, combinations of hardware and software, software, or software being executed. For example, a component may be, but is not limited to, a process that runs on a processor, a processor, an object, an executable file, a thread of execution, a program, and/or a computer. As shown in figures, both an application and a computing device that runs on a computing device may be components. One or more components may reside within the process and/or the execution thread. The components may be located on one computer and/or distributed between two or more computers. In addition, these components may be executed from various computer-readable media that store various data structures. The components may communicate by using a local and/or remote process based on a signal having one or more data packets (for example, data from two components interacting with another component in a local system, a distributed system, and/or a network such as the Internet interacting with another system by using the signal).

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of this disclosure.

A person skilled in the art may clearly understand that, for the purpose of convenient and brief description, for a detailed working process of the foregoing system, apparatus, and unit, refer to a corresponding process in the foregoing method embodiments. Details are not described herein again.

In the several embodiments provided in this disclosure, it should be understood that the disclosed system, apparatus, and method may be implemented in another manner. For example, the described apparatus embodiments are merely examples. For example, division into units is merely logical function division and may be other division in an actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or another form.

The units described as separate parts may or may not be physically separate, and parts displayed as units may or may not be physical units, and may be located at one location, or may be distributed on a plurality of network units. Some or all of the units may be selected based on actual requirements to achieve the objectives of the solutions of embodiments.

In addition, functional units in the embodiments of this disclosure may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of this disclosure essentially, or the part contributing to the conventional technology, or some of the technical solutions may be implemented in a form of a software product. The computer software product is stored in a storage medium, and includes several instructions for instructing a computer device (which may be a personal computer, a server, or a network device) to perform all or some of the steps of the methods described in the embodiments of this disclosure. The foregoing storage medium includes: any medium that can store program code, such as a USB flash drive, a removable hard disk, a read-only only memory, a random access memory, a magnetic disk, or an optical disc.

The foregoing description is merely specific implementations of this disclosure, but the protection scope of this disclosure is not limited thereto. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. A convolutional code rate matching method, comprising:
generating a second codeword, wherein a puncturing pattern of the second codeword is generated based on a puncturing pattern of a first codeword, the puncturing pattern of the first codeword comprises a first puncturing location set, the puncturing pattern of the second codeword comprises a second puncturing location set, and the second puncturing location set is a subset of the first puncturing location set; and
sending the second codeword,
wherein the first codeword corresponds to a first code rate, the second codeword corresponds to a second code rate, either the first code rate or the second code rate is a code rate in Table A, the first puncturing location set comprises a first puncturing location corresponding to the first code rate in Table A and all puncturing locations located before the first puncturing location in Table A, and the second puncturing location set comprises a second puncturing location corresponding to the second code rate in Table A and all puncturing locations located before the second puncturing location in Table A; and Table A is shown as follows:

TABLE A

| Code rate | Index of a puncturing location |
|---|---|
| 0.500 | |
| 0.508 | 59 |
| 0.517 | 31 |
| 0.526 | 11 |
| 0.536 | 39 |
| 0.545 | 51 |
| 0.556 | 19 |
| 0.566 | 3 |
| 0.577 | 43 |
| 0.588 | 23 |
| 0.600 | 15 |
| 0.612 | 47 |
| 0.625 | 55 |
| 0.638 | 27 |
| 0.652 | 7 |
| 0.667 | 35 |
| 0.682 | 0 |
| 0.698 | 36 |
| 0.714 | 8 |
| 0.732 | 32 |
| 0.750 | 53 |
| 0.769 | 21 |
| 0.789 | 4 |
| 0.811 | 45 |
| 0.833 | 16 |
| 0.857 | 28 |
| 0.882 | 24 |
| 0.909 | 48 |
| 0.938 | 56 |
| 0.968 | 38 |
| 1.000 | 46 |

2. The method according to claim 1, wherein the first code rate is 5/6, the first puncturing location set is {59, 31, 11, 39, 51, 19, 3, 43, 23, 15, 47, 55, 27, 7, 35, 0, 36, 8, 32, 53, 21, 4, 45, 16}, the second code rate is 3/4, and the second puncturing location set is {59, 31, 11, 39, 51, 19, 3, 43, 23, 15, 47, 55, 27, 7, 35, 0, 36, 8, 32, 53};

the first code rate is 5/6, the first puncturing location set is {59, 31, 11, 39, 51, 19, 3, 43, 23, 15, 47, 55, 27, 7, 35, 0, 36, 8, 32, 53, 21, 4, 45, 16}, the second code rate is 2/3, and the second puncturing location set is {59, 31, 11, 39, 51, 19, 3, 43, 23, 15, 47, 55, 27, 7, 35}; or the first code rate is 3/4, the first puncturing location set is {59, 31, 11, 39, 51, 19, 3, 43, 23, 15, 47, 55, 27, 7, 35, 0, 36, 8, 32, 53}, the second code rate is 2/3, and the second puncturing location set is {59, 31, 11, 39, 51, 19, 3, 43, 23, 15, 47, 55, 27, 7, 35}.

3. The method according to claim 1, wherein before the generating a second codeword, the method further comprises:

performing convolutional encoding on an information bit sequence, to obtain a mother codeword at a code rate of 1/2;

performing rate matching on the mother codeword based on a puncturing pattern corresponding to the first puncturing location set, to obtain the first codeword; and outputting the first codeword.

4. The method according to claim 1, wherein after the sending the second codeword, the method further comprises:

generating a third codeword at a third code rate, wherein the third codeword is obtained by performing a repetition operation on a mother codeword based on a repetition pattern, the mother codeword is obtained by performing convolutional encoding on an information bit sequence, the third code rate is a code rate in Table E, and a repetition location of the repetition operation is a first repetition location corresponding to the third code rate in Table E and all repetition locations located before the first repetition location in Table E; and Table E is shown as follows:

TABLE E

| Code rate | Index of a repetition location |
|---|---|
| 0.5000 | |
| 0.4918 | 30 |
| 0.4839 | 2 |
| 0.4762 | 24 |
| 0.4688 | 46 |
| 0.4615 | 8 |
| 0.4545 | 37 |
| 0.4478 | 54 |
| 0.4412 | 19 |
| 0.4348 | 50 |
| 0.4286 | 15 |
| 0.4225 | 40 |
| 0.4167 | 57 |
| 0.4110 | 27 |
| 0.4054 | 12 |
| 0.4000 | 44 |
| 0.3947 | 5 |
| 0.3896 | 38 |
| 0.3846 | 16 |
| 0.3797 | 49 |
| 0.3750 | 23 |
| 0.3704 | 6 |
| 0.3659 | 42 |
| 0.3614 | 35 |
| 0.3571 | 1 |
| 0.3529 | 28 |
| 0.3488 | 34 |
| 0.3448 | 9 |
| 0.3409 | 58 |
| 0.3371 | 20 |
| 0.3333 | 36 |
| 0.3297 | 10 |
| 0.3261 | 45 |
| 0.3226 | 21 |
| 0.3191 | 53 |
| 0.3158 | 32 |
| 0.3125 | 4 |
| 0.3093 | 26 |
| 0.3061 | 56 |
| 0.3030 | 0 |
| 0.3000 | 17 |
| 0.2970 | 41 |
| 0.2941 | 47 |
| 0.2913 | 11 |
| 0.2885 | 52 |
| 0.2857 | 33 |
| 0.2830 | 25 |
| 0.2804 | 3 |
| 0.2778 | 18 |
| 0.2752 | 48 |
| 0.2727 | 13 |
| 0.2703 | 39 |
| 0.2679 | 14 |
| 0.2655 | 55 |
| 0.2632 | 31 |
| 0.2609 | 59 |
| 0.2586 | 22 |
| 0.2564 | 51 |
| 0.2542 | 29 |
| 0.2521 | 43 |
| 0.25 | 7 |
| 0.2479 | 32 |
| 0.2459 | 4 |
| 0.2439 | 26 |
| 0.2419 | 48 |
| 0.2400 | 10 |

TABLE E-continued

| Code rate | Index of a repetition location |
|---|---|
| 0.2381 | 39 |
| 0.2362 | 56 |
| 0.2344 | 21 |
| 0.2326 | 52 |
| 0.2308 | 17 |
| 0.2290 | 42 |
| 0.2273 | 59 |
| 0.2256 | 29 |
| 0.2239 | 14 |
| 0.2222 | 46 |
| 0.2206 | 7 |
| 0.2190 | 40 |
| 0.2174 | 18 |
| 0.2158 | 51 |
| 0.2143 | 25 |
| 0.2128 | 3 |
| 0.2113 | 8 |
| 0.2098 | 36 |
| 0.2083 | 30 |
| 0.2069 | 0 |
| 0.2055 | 43 |
| 0.2041 | 35 |
| 0.2027 | 12 |
| 0.2013 | 44 |
| 0.2000 | 16 |
| 0.1987 | 22 |
| 0.1974 | 55 |
| 0.1961 | 20 |
| 0.1948 | 50 |
| 0.1935 | 38 |
| 0.1923 | 11 |
| 0.1911 | 37 |
| 0.1899 | 54 |
| 0.1887 | 15 |
| 0.1875 | 47 |
| 0.1863 | 27 |
| 0.1852 | 56 |
| 0.1840 | 23 |
| 0.1829 | 34 |
| 0.1818 | 2 |
| 0.1807 | 9 |
| 0.1796 | 58 |
| 0.1786 | 28 |
| 0.1775 | 6 |
| 0.1765 | 49 |
| 0.1754 | 24 |
| 0.1744 | 31 |
| 0.1734 | 1 |
| 0.1724 | 45 |
| 0.1714 | 5 |
| 0.1705 | 19 |
| 0.1695 | 53 |
| 0.1685 | 33 |
| 0.1676 | 57 |
| 0.1667 | 13 |
| 0.1657 | 41 |
| 0.1648 | 28 |
| 0.1639 | 24 |
| 0.1630 | 2 |
| 0.1622 | 22 |
| 0.1613 | 50 |
| 0.1604 | 18 |
| 0.1596 | 45 |
| 0.1587 | 10 |
| 0.1579 | 26 |
| 0.1571 | 49 |
| 0.1563 | 59 |
| 0.1554 | 25 |
| 0.1546 | 52 |
| 0.1538 | 6 |
| 0.1531 | 37 |
| 0.1523 | 17 |
| 0.1515 | 9 |
| 0.1508 | 30 |
| 0.1500 | 42 |
| 0.1493 | 57 |
| 0.1485 | 38 |
| 0.1478 | 14 |
| 0.1471 | 46 |
| 0.1463 | 1 |
| 0.1456 | 21 |
| 0.1449 | 33 |
| 0.1442 | 8 |
| 0.1435 | 54 |
| 0.1429 | 23 |
| 0.1422 | 0 |
| 0.1415 | 41 |
| 0.1408 | 13 |
| 0.1402 | 20 |
| 0.1395 | 53 |
| 0.1389 | 48 |
| 0.1382 | 4 |
| 0.1376 | 32 |
| 0.1370 | 24 |
| 0.1364 | 12 |
| 0.1357 | 44 |
| 0.1351 | 40 |
| 0.1345 | 5 |
| 0.1339 | 16 |
| 0.1333 | 36 |
| 0.1327 | 58 |
| 0.1322 | 31 |
| 0.1316 | 39 |
| 0.1310 | 7 |
| 0.1304 | 27 |
| 0.1299 | 19 |
| 0.1293 | 47 |
| 0.1288 | 51 |
| 0.1282 | 11 |
| 0.1277 | 35 |
| 0.1271 | 3 |
| 0.1266 | 23 |
| 0.1261 | 55 |
| 0.1255 | 43 |

5. A communication apparatus, comprising:
a processor, configured to generate a second codeword, wherein a puncturing pattern of the second codeword is generated based on a puncturing pattern of a first codeword, the puncturing pattern of the first codeword comprises a first puncturing location set, the puncturing pattern of the second codeword comprises a second puncturing location set, and the second puncturing location set is a subset of the first puncturing location set; and
a transceiver, configured to send the second codeword, wherein the first codeword corresponds to a first code rate, the second codeword corresponds to a second code rate, either the first code rate or the second code rate is a code rate in Table A, the first puncturing location set comprises a first puncturing location corresponding to the first code rate in Table A and all puncturing locations located before the first puncturing location in Table A, and the second puncturing location set comprises a second puncturing location corresponding to the second code rate in Table A and all puncturing locations located before the second puncturing location in Table A; and
Table A is shown as follows:

TABLE A

| Code rate | Index of a puncturing location |
|---|---|
| 0.500 | |
| 0.508 | 59 |
| 0.517 | 31 |
| 0.526 | 11 |

TABLE A-continued

| Code rate | Index of a puncturing location |
|---|---|
| 0.536 | 39 |
| 0.545 | 51 |
| 0.556 | 19 |
| 0.566 | 3 |
| 0.577 | 43 |
| 0.588 | 23 |
| 0.600 | 15 |
| 0.612 | 47 |
| 0.625 | 55 |
| 0.638 | 27 |
| 0.652 | 7 |
| 0.667 | 35 |
| 0.682 | 0 |
| 0.698 | 36 |
| 0.714 | 8 |
| 0.732 | 32 |
| 0.750 | 53 |
| 0.769 | 21 |
| 0.789 | 4 |
| 0.811 | 45 |
| 0.833 | 16 |
| 0.857 | 28 |
| 0.882 | 24 |
| 0.909 | 48 |
| 0.938 | 56 |
| 0.968 | 38 |
| 1.000 | 46 |

6. The communication apparatus according to claim 5, wherein the first code rate is 5/6, the first puncturing location set is {59, 31, 11, 39, 51, 19, 3, 43, 23, 15, 47, 55, 27, 7, 35, 0, 36, 8, 32, 53, 21, 4, 45, 16}, the second code rate is 3/4, and the second puncturing location set is {59, 31, 11, 39, 51, 19, 3, 43, 23, 15, 47, 55, 27, 7, 35, 0, 36, 8, 32, 53};

the first code rate is 5/6, the first puncturing location set is {59, 31, 11, 39, 51, 19, 3, 43, 23, 15, 47, 55, 27, 7, 35, 0, 36, 8, 32, 53, 21, 4, 45, 16}, the second code rate is 2/3, and the second puncturing location set is {59, 31, 11, 39, 51, 19, 3, 43, 23, 15, 47, 55, 27, 7, 35}; or the first code rate is 3/4, the first puncturing location set is {59, 31, 11, 39, 51, 19, 3, 43, 23, 15, 47, 55, 27, 7, 35, 0, 36, 8, 32, 53}, the second code rate is 2/3, and the second puncturing location set is {59, 31, 11, 39, 51, 19, 3, 43, 23, 15, 47, 55, 27, 7, 35}.

7. The communication apparatus according to claim 5, wherein the processor is further configured to: perform convolutional encoding on an information bit sequence, to obtain a mother codeword at a code rate of 1/2; and perform rate matching on the mother codeword based on a puncturing pattern corresponding to the first puncturing location set, to obtain the first codeword; and the transceiver is further configured to send the first codeword.

8. The communication apparatus according to claim 5, wherein the transceiver is further configured to:

output a third codeword at a third code rate, wherein the third codeword is obtained by performing a repetition operation on a mother codeword based on a repetition pattern, the mother codeword is obtained by performing convolutional encoding on the information bit sequence, the third code rate is a code rate in Table E, and a repetition location of the repetition operation is a first repetition location corresponding to the third code rate in Table E and all repetition locations located before the first repetition location in Table E; and Table E is shown as follows:

TABLE E

| Code rate | Index of a repetition location |
|---|---|
| 0.5000 | 30 |
| 0.4918 | 2 |
| 0.4839 | 24 |
| 0.4762 | 46 |
| 0.4688 | 8 |
| 0.4615 | 37 |
| 0.4545 | 54 |
| 0.4478 | 19 |
| 0.4412 | 50 |
| 0.4348 | 15 |
| 0.4286 | 40 |
| 0.4225 | 57 |
| 0.4167 | 27 |
| 0.4110 | 12 |
| 0.4054 | 44 |
| 0.4000 | 5 |
| 0.3947 | 38 |
| 0.3896 | 16 |
| 0.3846 | 49 |
| 0.3797 | 23 |
| 0.3750 | 6 |
| 0.3704 | 42 |
| 0.3659 | 35 |
| 0.3614 | 1 |
| 0.3571 | 28 |
| 0.3529 | 34 |
| 0.3488 | 9 |
| 0.3448 | 58 |
| 0.3409 | 20 |
| 0.3371 | 36 |
| 0.3333 | 10 |
| 0.3297 | 45 |
| 0.3261 | 21 |
| 0.3226 | 53 |
| 0.3191 | 32 |
| 0.3158 | 4 |
| 0.3125 | 26 |
| 0.3093 | 56 |
| 0.3061 | 0 |
| 0.3030 | 17 |
| 0.3000 | 41 |
| 0.2970 | 47 |
| 0.2941 | 11 |
| 0.2913 | 52 |
| 0.2885 | 33 |
| 0.2857 | 25 |
| 0.2830 | 3 |
| 0.2804 | 18 |
| 0.2778 | 48 |
| 0.2752 | 13 |
| 0.2727 | 39 |
| 0.2703 | 14 |
| 0.2679 | 55 |
| 0.2655 | 31 |
| 0.2632 | 59 |
| 0.2609 | 22 |
| 0.2586 | 51 |
| 0.2564 | 29 |
| 0.2542 | 43 |
| 0.2521 | 7 |
| 0.25 | 32 |
| 0.2479 | 4 |
| 0.2459 | 26 |
| 0.2439 | 48 |
| 0.2419 | 10 |
| 0.2400 | 39 |
| 0.2381 | 56 |
| 0.2362 | 21 |
| 0.2344 | 52 |
| 0.2326 | 17 |
| 0.2308 | 42 |
| 0.2290 | 59 |
| 0.2273 | 29 |
| 0.2256 | 14 |
| 0.2239 | 46 |
| 0.2222 | 7 |
| 0.2206 | 40 |
| 0.2190 | |

TABLE E-continued

| Code rate | Index of a repetition location |
|---|---|
| 0.2174 | 18 |
| 0.2158 | 51 |
| 0.2143 | 25 |
| 0.2128 | 3 |
| 0.2113 | 8 |
| 0.2098 | 36 |
| 0.2083 | 30 |
| 0.2069 | 0 |
| 0.2055 | 43 |
| 0.2041 | 35 |
| 0.2027 | 12 |
| 0.2013 | 44 |
| 0.2000 | 16 |
| 0.1987 | 22 |
| 0.1974 | 55 |
| 0.1961 | 20 |
| 0.1948 | 50 |
| 0.1935 | 38 |
| 0.1923 | 11 |
| 0.1911 | 37 |
| 0.1899 | 54 |
| 0.1887 | 15 |
| 0.1875 | 47 |
| 0.1863 | 27 |
| 0.1852 | 56 |
| 0.1840 | 23 |
| 0.1829 | 34 |
| 0.1818 | 2 |
| 0.1807 | 9 |
| 0.1796 | 58 |
| 0.1786 | 28 |
| 0.1775 | 6 |
| 0.1765 | 49 |
| 0.1754 | 24 |
| 0.1744 | 31 |
| 0.1734 | 1 |
| 0.1724 | 45 |
| 0.1714 | 5 |
| 0.1705 | 19 |
| 0.1695 | 53 |
| 0.1685 | 33 |
| 0.1676 | 57 |
| 0.1667 | 13 |
| 0.1657 | 41 |
| 0.1648 | 28 |
| 0.1639 | 24 |
| 0.1630 | 2 |
| 0.1622 | 22 |
| 0.1613 | 50 |
| 0.1604 | 18 |
| 0.1596 | 45 |
| 0.1587 | 10 |
| 0.1579 | 26 |
| 0.1571 | 49 |
| 0.1563 | 59 |
| 0.1554 | 25 |
| 0.1546 | 52 |
| 0.1538 | 6 |
| 0.1531 | 37 |
| 0.1523 | 17 |
| 0.1515 | 9 |
| 0.1508 | 30 |
| 0.1500 | 42 |
| 0.1493 | 57 |
| 0.1485 | 38 |
| 0.1478 | 14 |
| 0.1471 | 46 |
| 0.1463 | 1 |
| 0.1456 | 21 |
| 0.1449 | 33 |
| 0.1442 | 8 |
| 0.1435 | 54 |
| 0.1429 | 23 |
| 0.1422 | 0 |
| 0.1415 | 41 |
| 0.1408 | 13 |
| 0.1402 | 20 |
| 0.1395 | 53 |

TABLE E-continued

| Code rate | Index of a repetition location |
|---|---|
| 0.1389 | 48 |
| 0.1382 | 4 |
| 0.1376 | 32 |
| 0.1370 | 24 |
| 0.1364 | 12 |
| 0.1357 | 44 |
| 0.1351 | 40 |
| 0.1345 | 5 |
| 0.1339 | 16 |
| 0.1333 | 36 |
| 0.1327 | 58 |
| 0.1322 | 31 |
| 0.1316 | 39 |
| 0.1310 | 7 |
| 0.1304 | 27 |
| 0.1299 | 19 |
| 0.1293 | 47 |
| 0.1288 | 51 |
| 0.1282 | 11 |
| 0.1277 | 35 |
| 0.1271 | 3 |
| 0.1266 | 23 |
| 0.1261 | 55 |
| 0.1255 | 43 |

9. A computer-readable storage medium, wherein the computer-readable storage medium stores computer instructions, and when the computer instructions are run on a computer, a method as following is implemented:
generating a second codeword, wherein a puncturing pattern of the second codeword is generated based on a puncturing pattern of a first codeword, the puncturing pattern of the first codeword comprises a first puncturing location set, the puncturing pattern of the second codeword comprises a second puncturing location set, and the second puncturing location set is a subset of the first puncturing location set; and
sending the second codeword,
wherein the first codeword corresponds to a first code rate, the second codeword corresponds to a second code rate, either the first code rate or the second code rate is a code rate in Table A, the first puncturing location set comprises a first puncturing location corresponding to the first code rate in Table A and all puncturing locations located before the first puncturing location in Table A, and the second puncturing location set comprises a second puncturing location corresponding to the second code rate in Table A and all puncturing locations located before the second puncturing location in Table A; and
Table A is shown as follows:

TABLE A

| Code rate | Index of a puncturing location |
|---|---|
| 0.500 | |
| 0.508 | 59 |
| 0.517 | 31 |
| 0.526 | 11 |
| 0.536 | 39 |
| 0.545 | 51 |
| 0.556 | 19 |
| 0.566 | 3 |
| 0.577 | 43 |
| 0.588 | 23 |
| 0.600 | 15 |
| 0.612 | 47 |
| 0.625 | 55 |
| 0.638 | 27 |

TABLE A-continued

| Code rate | Index of a puncturing location |
|---|---|
| 0.652 | 7 |
| 0.667 | 35 |
| 0.682 | 0 |
| 0.698 | 36 |
| 0.714 | 8 |
| 0.732 | 32 |
| 0.750 | 53 |
| 0.769 | 21 |
| 0.789 | 4 |
| 0.811 | 45 |
| 0.833 | 16 |
| 0.857 | 28 |
| 0.882 | 24 |
| 0.909 | 48 |
| 0.938 | 56 |
| 0.968 | 38 |
| 1.000 | 46 |

10. The computer-readable storage medium according to claim 9, wherein the first code rate is 5/6, the first puncturing location set is {59, 31, 11, 39, 51, 19, 3, 43, 23, 15, 47, 55, 27, 7, 35, 0, 36, 8, 32, 53, 21, 4, 45, 16}, the second code rate is 3/4, and the second puncturing location set is {59, 31, 11, 39, 51, 19, 3, 43, 23, 15, 47, 55, 27, 7, 35, 0, 36, 8, 32, 53};

the first code rate is 5/6, the first puncturing location set is {59, 31, 11, 39, 51, 19, 3, 43, 23, 15, 47, 55, 27, 7, 35, 0, 36, 8, 32, 53, 21, 4, 45, 16}, the second code rate is 2/3, and the second puncturing location set is {59, 31, 11, 39, 51, 19, 3, 43, 23, 15, 47, 55, 27, 7, 35}; or the first code rate is 3/4, the first puncturing location set is {59, 31, 11, 39, 51, 19, 3, 43, 23, 15, 47, 55, 27, 7, 35, 0, 36, 8, 32, 53}, the second code rate is 2/3, and the second puncturing location set is {59, 31, 11, 39, 51, 19, 3, 43, 23, 15, 47, 55, 27, 7, 35}.

11. The computer-readable storage medium according to claim 9, wherein before the generating a second codeword, the method further comprises:

performing convolutional encoding on an information bit sequence, to obtain a mother codeword at a code rate of 1/2;

performing rate matching on the mother codeword based on a puncturing pattern corresponding to the first puncturing location set, to obtain the first codeword; and outputting the first codeword.

* * * * *